US008748793B2

(12) United States Patent
Shimoda et al.

(10) Patent No.: US 8,748,793 B2
(45) Date of Patent: *Jun. 10, 2014

(54) IMAGE PICKUP ELEMENT AND IMAGE PICKUP DEVICE

(71) Applicant: Sony Corporation, Tokyo (JP)

(72) Inventors: Kazuhito Shimoda, Kyoto (JP);
Shinichi Fuji, Osaka (JP); Yasutoshi Katsuda, Osaka (JP); Hiroki Ui, Tokyo (JP); Yutaka Nishimura, Kanagawa (JP)

(73) Assignee: Sony Corporation (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/670,201

(22) Filed: Nov. 6, 2012

(65) Prior Publication Data

US 2013/0113982 A1    May 9, 2013

Related U.S. Application Data

(63) Continuation of application No. 12/655,755, filed on Jan. 6, 2010, now Pat. No. 8,304,708.

(30) Foreign Application Priority Data

Jan. 8, 2009    (JP) .................................. 2009-002326

(51) Int. Cl.
*H01L 27/00* (2006.01)
*G03B 13/00* (2006.01)
*H04N 5/232* (2006.01)
*H04N 5/225* (2006.01)

(52) U.S. Cl.
USPC ........................ 250/208.1; 348/340; 348/349

(58) Field of Classification Search
USPC ............ 257/291, 294, 432; 250/208.1, 201.2, 250/201.7, 201.8; 348/273, 275, 276, 302, 348/308, 335, 340, 349, 353–356, 374
See application file for complete search history.

(56) References Cited

U.S. PATENT DOCUMENTS

| | | | | |
|---|---|---|---|---|
| 6,819,360 | B1 * | 11/2004 | Ide et al. | 348/340 |
| 7,522,341 | B2 * | 4/2009 | Mouli | 359/619 |
| 7,586,072 | B2 * | 9/2009 | Kusaka | 250/201.2 |
| 7,586,588 | B2 * | 9/2009 | Kusaka | 356/30 |
| 7,711,261 | B2 * | 5/2010 | Kusaka | 396/111 |

(Continued)

FOREIGN PATENT DOCUMENTS

| | | |
|---|---|---|
| JP | 2001-250931 A | 9/2001 |
| JP | 2005-303409 A | 10/2005 |

*Primary Examiner* — John Lee
(74) *Attorney, Agent, or Firm* — Lerner, David, Littenberg, Krumholz & Mentlik, LLP

(57) ABSTRACT

An image pickup element includes a light-receiving portion having a matrix arrangement formed by disposing first-direction arrays, each having photoelectric conversion portions arranged in a first direction with a predetermined gap maintained therebetween, in a second direction orthogonal to the first direction, and micro-lenses provided above the light-receiving portion. A certain first-direction array in the matrix arrangement is provided with a pair of photoelectric conversion portions that optically receive, via a pair of micro-lenses, photographic-subject light beams passing through a pair of segmental regions in an exit pupil of a photographic optical system, the pair of segmental regions being disposed biasedly in opposite directions from each other in the first direction. The pair of micro-lenses is disposed such that light axes thereof extend through vicinities of edges of the pair of photoelectric conversion portions, the edges being the farthest edges from each other in the first direction.

6 Claims, 13 Drawing Sheets

(56) References Cited

U.S. PATENT DOCUMENTS

| | | | |
|---|---|---|---|
| 7,715,703 B2* | 5/2010 | Utagawa et al. | 396/111 |
| 7,751,700 B2* | 7/2010 | Kusaka | 396/79 |
| 7,783,185 B2* | 8/2010 | Kusaka | 396/111 |
| 7,792,420 B2* | 9/2010 | Kusaka | 396/79 |
| 7,812,881 B2* | 10/2010 | Kusaka | 348/350 |
| 7,822,333 B2* | 10/2010 | Kusaka | 396/80 |
| 7,863,550 B2* | 1/2011 | Kusaka | 250/201.8 |
| 7,873,267 B2* | 1/2011 | Kusaka | 396/104 |
| 7,978,255 B2* | 7/2011 | Suzuki | 348/350 |
| 8,098,321 B2* | 1/2012 | Shimoda et al. | 348/349 |
| 8,304,708 B2* | 11/2012 | Shimoda et al. | 250/208.1 |
| 2008/0283724 A1* | 11/2008 | Goto | 250/201.6 |
| 2010/0176273 A1* | 7/2010 | Shimoda et al. | 250/208.1 |
| 2010/0177205 A1* | 7/2010 | Shimoda et al. | 348/222.1 |
| 2011/0085786 A1* | 4/2011 | Tamaki | 396/104 |
| 2011/0164166 A1* | 7/2011 | Oikawa | 348/340 |

* cited by examiner

IMAGE PICKUP ELEMENT AND IMAGE PICKUP DEVICE

CROSS-REFERENCE TO RELATED APPLICATIONS

This application is a continuation of U.S. application Ser. No. 12/655,755 filed on Jan. 6, 2010, which claims priority from Japanese Patent Application No. JP 2009-002326 filed in the Japanese Patent Office on Jan. 8, 2009, the entire disclosures of which are incorporated herein by reference.

BACKGROUND OF THE INVENTION

1. Field of the Invention

The present invention relates to the technology of image pickup elements capable of optically receiving photographic-subject light beams passing through exit pupils of photographic optical systems.

2. Description of the Related Art

In image pickup devices, such as single-lens reflex cameras with interchangeable lenses, image pickup elements capable of performing focus detection based on a phase-difference detection method are used. An image pickup element of this type will sometimes be referred to as "image pickup element having a phase-difference detecting function" hereinafter. Specifically, in an image pickup element having a phase-difference detecting function, a pair of photoelectric conversion portions (photodiodes) that generate pixel signals by optically receiving photographic-subject light beams passing through a pair of segmental regions (for example, left and right pupil segments) in an exit pupil of an interchangeable lens (photographic optical system) is provided in a plurality. The following are examples of such image pickup elements of the related art.

For example, Japanese Unexamined Patent Application Publication No. 2001-250931 discloses an image pickup element having a phase-difference detecting function, in which bisected-like photoelectric conversion portions (referred to as "half-sized photoelectric conversion portions" hereinafter) are provided in each of normal pixels (R, G, and B pixels) that acquire image signals of a photographic subject. In other words, a pair of half-sized photoelectric conversion portions is disposed below each micro-lens.

Japanese Unexamined Patent Application Publication No. 2005-303409 discloses another example of an image pickup element having a phase-difference detecting function, which limits photographic-subject light with small openings in a light-blocking mask made of a metallic layer in a pair of neighboring pixels so as to optically receive a pair of segmental regions in the exit pupil with a pair of photoelectric conversion portions.

SUMMARY OF THE INVENTION

However, in the image pickup element according to Japanese Unexamined Patent Application Publication No. 2001-250931, it may be necessary to install a transistor, which is for converting the output from each half-sized photoelectric conversion portion to an electric signal, near the photoelectric conversion portion. This means that the photoelectric conversion portion is reduced in size by an amount equivalent to the installation space for the transistor and thus lowers the amount of light that can be received by the photoelectric conversion portion (i.e., the sensitivity of the photoelectric conversion portion). This makes it difficult to accurately perform focus detection based on a phase-difference detection method.

On the other hand, in the image pickup element according to Japanese Unexamined Patent Application Publication No. 2005-303409, since the photographic-subject light is limited using a small opening in the light-blocking mask for each pixel, further size reduction of the openings in the light-blocking mask is desired as pixels become miniaturized with an increase in pixels in image pickup elements. However, there is a possibility that formation of such openings may be difficult in view of manufacture.

It is desirable to provide an image pickup element having a phase-difference detecting function that is capable of accurately performing focus detection based on a phase-difference detection method and that can be manufactured satisfactorily even as pixels become miniaturized.

According to a first embodiment of the present invention, there is provided an image pickup element including a light-receiving portion having a matrix arrangement of photoelectric conversion portions, the matrix arrangement being formed by disposing a plurality of first-direction arrays, each having photoelectric conversion portions arranged in a first direction with a predetermined gap maintained therebetween, in a second direction that is orthogonal to the first direction, and a plurality of micro-lenses provided above the light-receiving portion. A certain first-direction array in the matrix arrangement of photoelectric conversion portions is provided with a pair of photoelectric conversion portions that optically receive, via a pair of micro-lenses, photographic-subject light beams passing through a pair of segmental regions in an exit pupil of a photographic optical system, the pair of segmental regions being disposed biasedly in opposite directions from each other in the first direction. The pair of micro-lenses is disposed such that light axes thereof extend through vicinities of edges of the pair of photoelectric conversion portions, the edges being the farthest edges from each other in the first direction.

According to a second embodiment of the present invention, there is provided an image pickup device including a photographic optical system and an image pickup element configured to optically receive photographic-subject light passing through an exit pupil of the photographic optical system. The image pickup element includes a light-receiving portion having a matrix arrangement of photoelectric conversion portions, the matrix arrangement being formed by disposing a plurality of first-direction arrays, each having photoelectric conversion portions arranged in a first direction with a predetermined gap maintained therebetween, in a second direction that is orthogonal to the first direction, and a plurality of micro-lenses provided above the light-receiving portion. A certain first-direction array in the matrix arrangement of photoelectric conversion portions is provided with a pair of photoelectric conversion portions that optically receive, via a pair of micro-lenses, photographic-subject light beams passing through a pair of segmental regions in the exit pupil, the pair of segmental regions being disposed biasedly in opposite directions from each other in the first direction. The pair of micro-lenses is disposed such that light axes thereof extend through vicinities of edges of the pair of photoelectric conversion portions, the edges being the farthest edges from each other in the first direction.

According to the embodiments of the present invention, the image pickup element can accurately perform focus detection based on a phase-difference detection method and can be manufactured satisfactorily even as pixels become miniaturized.

DESCRIPTION OF THE PREFERRED EMBODIMENTS EMBODIMENT CONFIGURATION OF RELEVANT PORTION OF IMAGE PICKUP DEVICE

Figure 1:
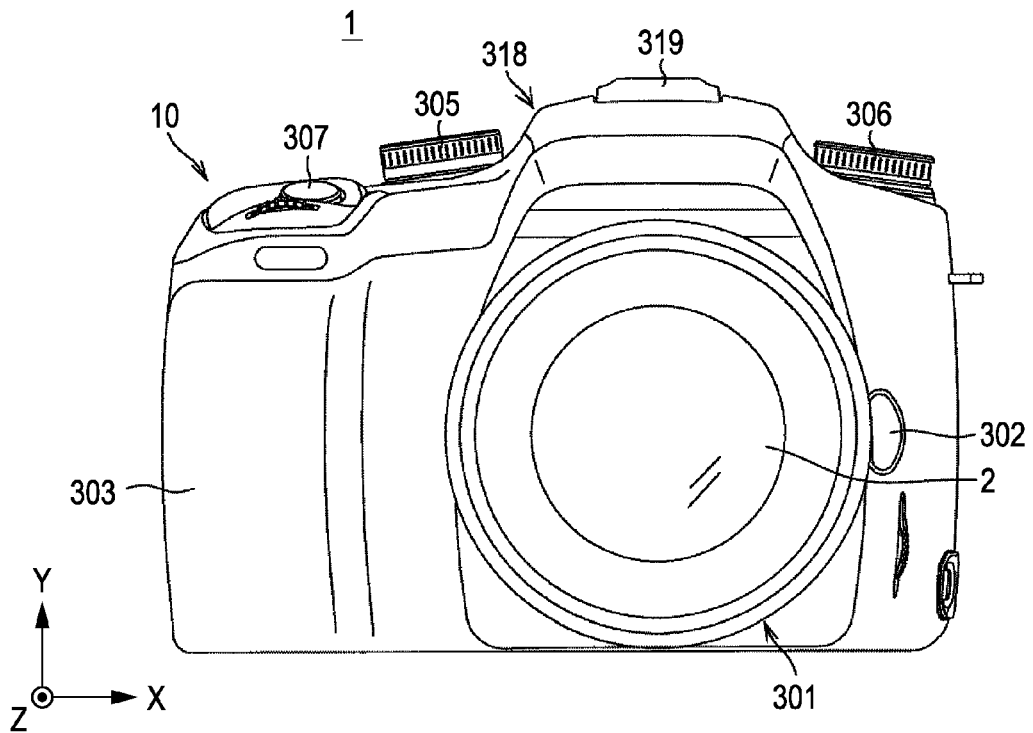
FIG. 1 illustrates an external configuration of an image pickup device according to an embodiment of the present invention.
Figure 2:
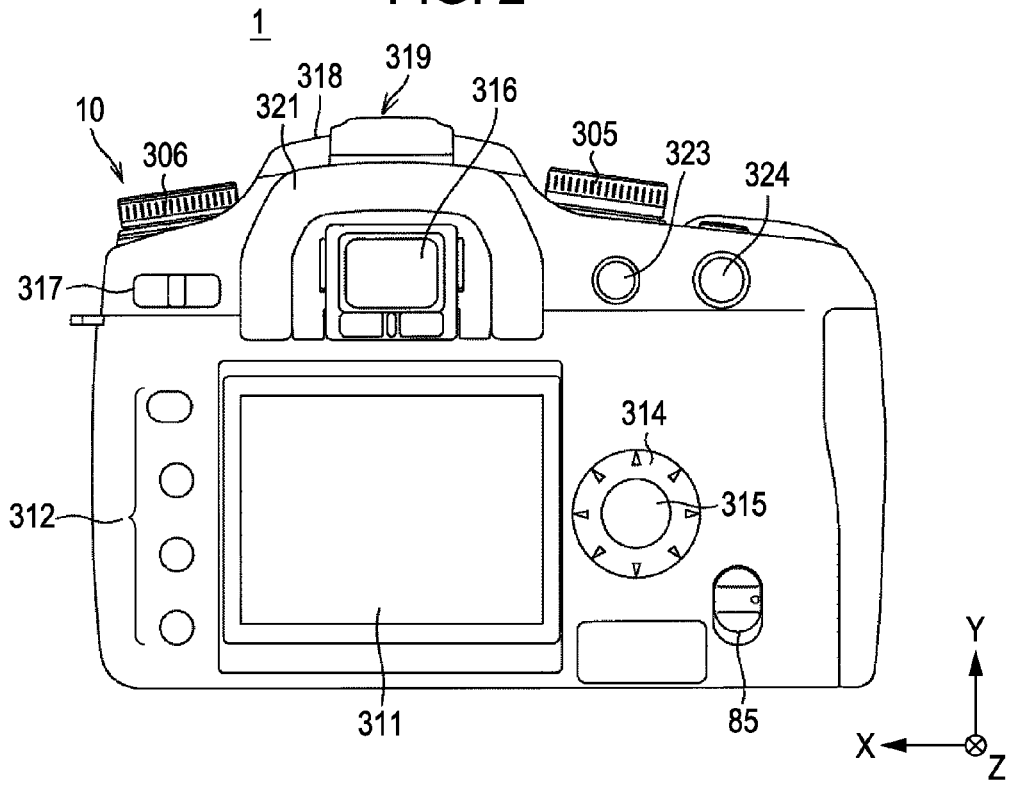
FIG. 2 also illustrates the external configuration of the image pickup device.

FIGS. 1 and 2 illustrate an external configuration of an image pickup device 1 according to an embodiment of the present invention. Specifically, FIGS. 1 and 2 are a front view and a rear view, respectively.

The image pickup device 1 is, for example, a digital still camera of a single-lens reflex type and includes a camera body 10 and an interchangeable lens 2 serving as a photographic lens detachable to the camera body 10.

Referring to FIG. 1, the front surface of the camera body 10 is provided with a mounting portion 301 located substantially in the middle of the front surface and to which the interchangeable lens 2 is fitted, a lens replacement button 302 disposed to the right of the mounting portion 301, and a grippable portion 303. The camera body 10 is provided with a mode setting dial 305 disposed in an upper left section of the front surface, a control-value setting dial 306 disposed in an upper right section of the front surface, and a shutter button 307 disposed on the upper surface of the grippable portion 303.

Referring to FIG. 2, the rear surface of the camera body 10 is provided with a liquid crystal display (LCD) 311, a setting-button group 312 disposed to the left of the LCD 311, a cross keypad 314 disposed to the right of the LCD 311, and a push button 315 disposed in the center of the cross keypad 314. The rear surface of the camera body 10 is also provided with an electronic viewfinder (EVF) 316 disposed above the LCD 311, an eyecup 321 surrounding the EVF 316, and a main switch 317 disposed to the left of the EVF 316. Moreover, the rear surface of the camera body 10 is provided with an exposure correction button 323 and an automatic-exposure (AE) lock button 324 disposed to the right of the EVF 316, and a flash portion 318 and a connection terminal portion 319 disposed above the EVF 316.

The mounting portion 301 is provided with a connector Ec (see FIG. 4) used for an electrical connection with the fitted interchangeable lens 2 and a coupler 75 (see FIG. 4) used for a mechanical connection.

The lens replacement button 302 is a button to be pressed when detaching the interchangeable lens 2 from the mounting portion 301.

The grippable portion 303 is a portion to be gripped by a user during photographic shooting using the image pickup device 1 and is provided with protrusions and depressions that conform to the shape of the human hand to enhance fittability. The grippable portion 303 contains a battery accommodating chamber and a card accommodating chamber (not shown). The battery accommodating chamber is configured to accommodate a battery 69B (see FIG. 4) serving as a power source for the camera, whereas the card accommodating chamber is configured to detachably accommodate a memory card 67 (see FIG. 4) for storing image data of photographic images. The grippable portion 303 may be provided with a grip sensor for detecting whether or not the grippable portion 303 is gripped by a user.

The mode setting dial 305 and the control-value setting dial 306 are each formed of a substantially disk-shaped member that is rotatable within a plane substantially parallel to the upper surface of the camera body 10. The mode setting dial 305 is provided for alternatively selecting modes and functions included in the image pickup device 1, which include an automatic-exposure (AE) control mode and an automatic-focus (AF) control mode, various shooting modes, such as a still-image shooting mode for shooting a single still image and a continuous shooting mode for performing continuous shooting, and a reproduction mode for reproducing a recorded image. On the other hand, the control-value setting dial 306 is provided for setting control values for various functions included in the image pickup device 1.

The shutter button 307 is a press button that can be operated to a half-pressed state, in which the button is pressed halfway, and a fully-pressed state, in which the button is pressed further downward. When the shutter button 307 is half-pressed in the still-image shooting mode, a preparatory operation (including setting of an exposure control value and focus detection) for shooting a still image of a photographic subject is executed. When the shutter button 307 is fully pressed, a photographic shooting operation (a series of processes including exposing an image pickup element 101 (see FIG. 3) to light and performing predetermined image processing on an image signal obtained by the exposure process so as to record the image in, for example, the memory card) is executed.

The LCD 311 includes a color liquid-crystal panel capable of performing image display and is configured to, for example, display an image picked up by the image pickup element 101 (see FIG. 3) or reproduce and display a recorded image, as well as display a setting screen for functions and modes included in the image pickup device 1. As an alternative to the LCD 311, an organic electroluminescence display unit or a plasma display unit may be used.

The setting-button group 312 includes buttons for operating various functions included in the image pickup device 1. The setting-button group 312 includes, for example, a selection confirmation switch for confirming the content selected on a menu screen displayed on the LCD 311, a selection cancellation switch, a menu display switch for switching the content on the menu screen, a display on/off switch, and a display enlargement switch.

The cross keypad 314 has an annular component including multiple pressable sections (i.e., sections denoted by triangular arrows in FIG. 2) arranged at fixed intervals in the circumferential direction, and is capable of detecting a pressing operation performed on one of the pressable sections in accordance with a corresponding one of contacts (switches) (not shown) provided to face the corresponding pressable sections. The push button 315 is disposed in the center of the cross keypad 314. The cross keypad 314 and the push button 315 are provided for changing the magnification (moving a zoom lens 212 (see FIG. 4) in the wide-angle-end direction or the telephoto-end direction), frame-advancing recorded images reproduced on, for example, the LCD 311, and inputting commands for setting shooting conditions (including the aperture, shutter speed, and on/off mode of flash).

The EVF 316 includes a liquid crystal panel 310 (see FIG. 3) and is configured to display an image picked up by the image pickup element 101 (see FIG. 3) or reproduce and display a recorded image. The EVF 316 or the LCD 311 performs a live-view (preview) display operation for displaying a photographic subject in a video mode on the basis of image signals sequentially produced by the image pickup element 101 prior to the actual shooting operation (i.e., a shooting operation for recording an image) so as to allow the user to visually check the photographic subject actually picked up by the image pickup element 101.

The main switch 317 is formed of a horizontally slidable switch having two contacts. When the main switch 317 is set in the left position, the image pickup device 1 is turned on, whereas when the main switch 317 is set in the right position, the image pickup device 1 is turned off.

The flash portion 318 is defined by a built-in flashlight of a pop-up type. On the other hand, when an external flashlight, for example, is to be attached to the camera body 10, the external flashlight is connected using the connection terminal portion 319.

The eyecup 321 is a C-shaped light-blocking member having light-blocking properties for preventing penetration of external light into the EVF 316.

The exposure correction button 323 is for manually adjusting exposure values (aperture and shutter speed). The AE lock button 324 is for fixing the exposure.

The interchangeable lens 2 functions as a lens window that takes in light (optical image) from a photographic subject and also functions as a photographic optical system for guiding the photographic-subject light to the image pickup element 101 disposed within the camera body 10. This interchangeable lens 2 can be detached from the camera body 10 by pressing the lens replacement button 302.

The interchangeable lens 2 includes a lens group 21 (see FIG. 4) constituted by a plurality of lenses arranged in a series fashion along a light axis LT. This lens group 21 includes a focusing lens 211 (see FIG. 4) for a focal adjustment and the zoom lens 212 (see FIG. 4) for varying the magnification, and is configured to perform a focal adjustment or magnification variation by driving the focusing lens 211 or the zoom lens 212 in the direction of the light axis LT (see FIG. 3). The interchangeable lens 2 also has a lens barrel provided with an operable ring. The operable ring is disposed at an appropriate section on the outer periphery of the lens barrel and is rotatable along the outer peripheral surface of the lens barrel. In response to a manual operation or an automatic operation, the zoom lens 212 moves in the light-axis direction in accordance with the rotating direction and the rotating amount of the operable ring, thereby setting the zoom magnification (shooting magnification) to a value corresponding to the position to which the zoom lens 212 is moved.

Internal Configuration of Image Pickup Device 1

Figure 3:
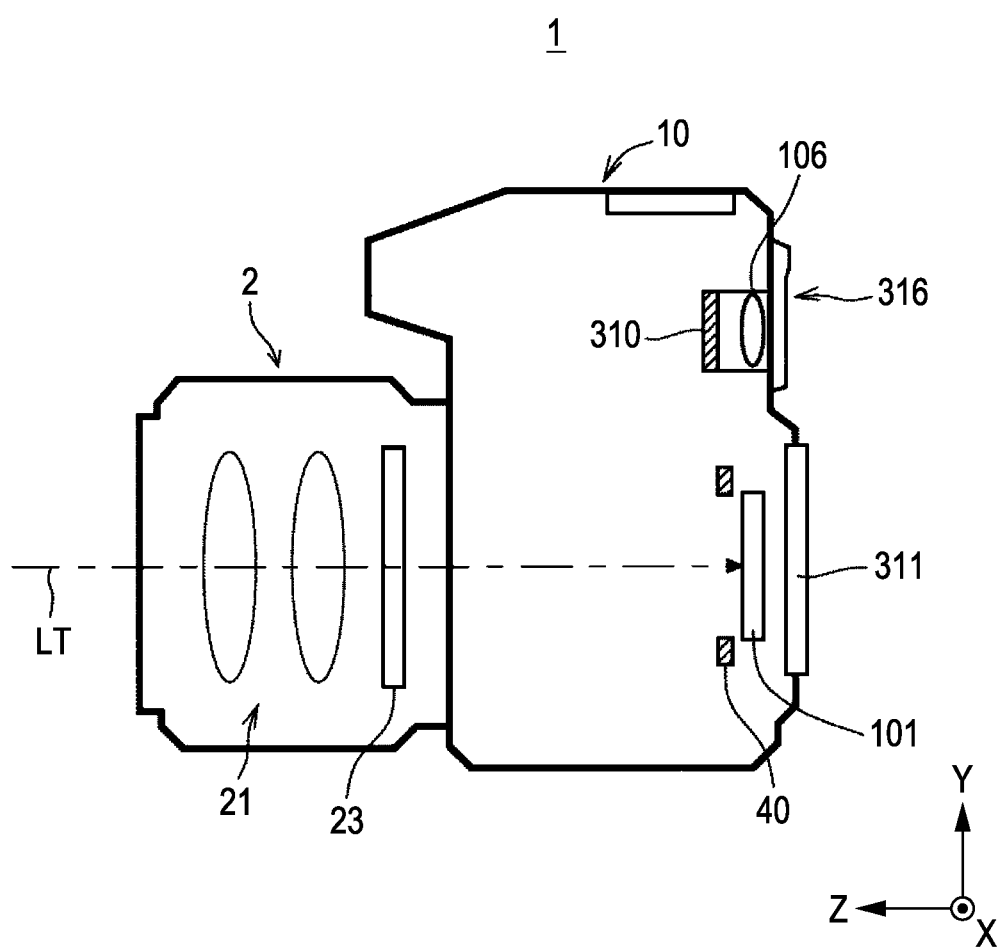
FIG. 3 is a vertical sectional view of the image pickup device.

An internal configuration of the image pickup device 1 will now be described. FIG. 3 is a vertical sectional view of the image pickup device 1. As shown in FIG. 3, the camera body 10 contains, for example, the image pickup element 101 and the EVF 316.

The image pickup element 101 is disposed on the light axis LT of the lens group 21 included in the interchangeable lens 2, when the interchangeable lens 2 is fitted to the camera body 10, and is orthogonal to the light axis LT. The image pickup element 101 is defined by, for example, a CMOS color area sensor (CMOS-type image pickup element) having photodiodes constituting a plurality of pixels arranged two-dimensionally in a matrix. The image pickup element 101 generates analog electric signals (image signals) of red (R), green (G), and blue (B) color components related to photographic-subject light optically received via the interchangeable lens 2 and outputs the image signals for the R, G, and B colors. A detailed description of the configuration of the image pickup element 101 will be provided later.

A shutter unit 40 is disposed in front of the image pickup element 101 in the light-axis direction. The shutter unit 40 is a mechanical focal plane shutter with a curtain that moves in the vertical direction. With the opening and closing of the curtain, the shutter opens and closes the light path of photographic-subject light guided to the image pickup element 101 along the light axis LT. If the image pickup element 101 is of a complete electronic shutter type, the shutter unit 40 can be omitted.

The EVF 316 includes the liquid crystal panel 310 and an ocular lens 106. The liquid crystal panel 310 is, for example, a color liquid-crystal panel capable of performing image display and is capable of displaying an image picked up by the image pickup element 101. The ocular lens 106 guides a subject image displayed on the liquid crystal panel 310 outward of the EVF 316. With such a configuration of the EVF 316, the user can visually check the photographic subject picked up by the image pickup element 101.

Electrical Configuration of Image Pickup Device 1

Figure 4:
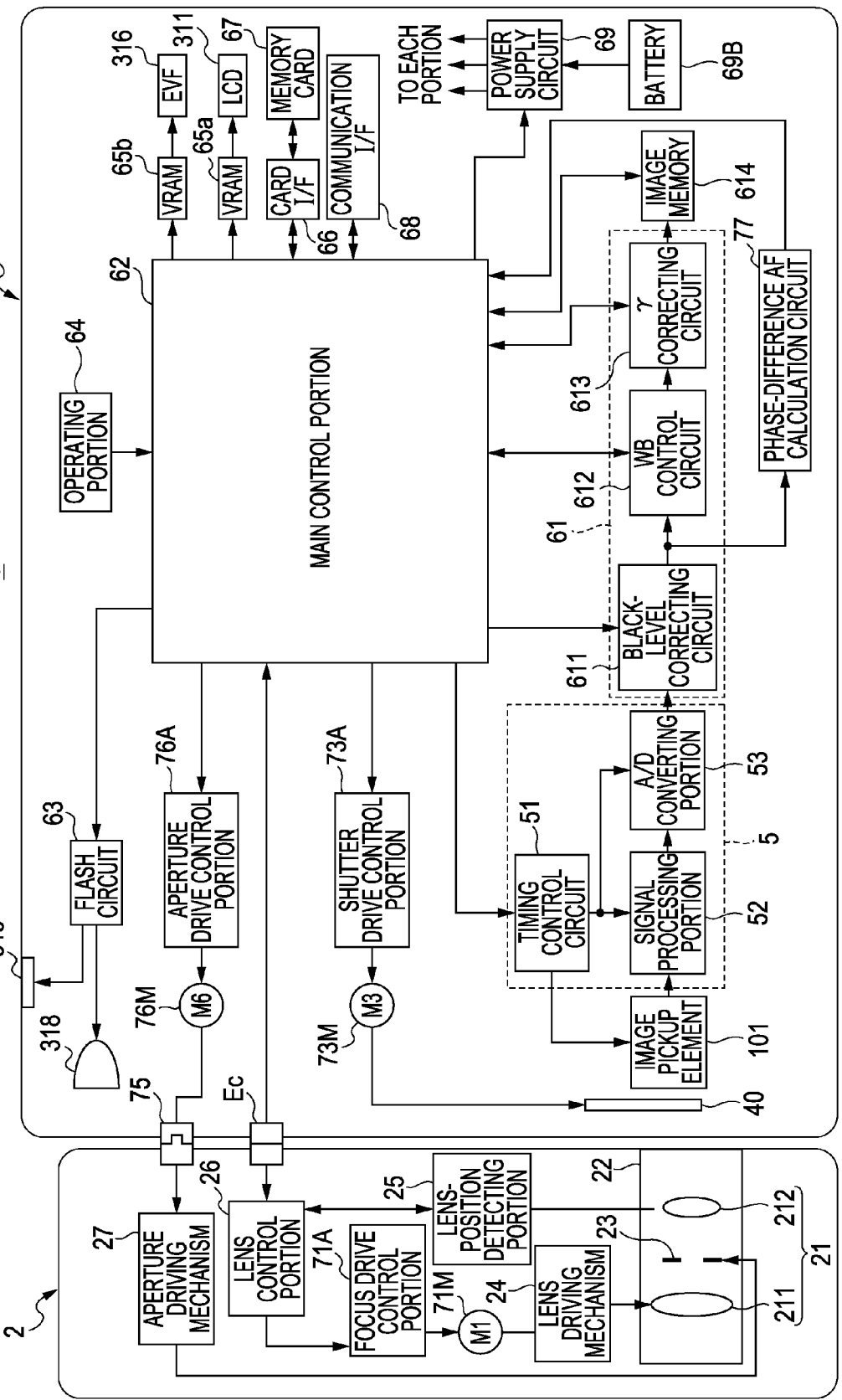
FIG. 4 is a block diagram showing an electrical configuration of the image pickup device.

FIG. 4 is a block diagram showing an electrical configuration of the image pickup device 1. Components shown in FIG. 4 that are the same as those in FIGS. 1 to 3 are given the same reference numerals. For the sake of convenience, an electrical configuration of the interchangeable lens 2 will be described first.

In addition to the lens group 21 constituting the aforementioned photographic optical system, the interchangeable lens 2 includes a lens driving mechanism 24, a lens-position detecting portion 25, a lens control portion 26, and an aperture driving mechanism 27.

In the lens group 21, the focusing lens 211, the zoom lens 212, and an aperture stop 23 for adjusting the amount of light to be incident on the image pickup element 101 included in the camera body 10 are held in the direction of the light axis LT (FIG. 3) within the lens barrel. The lens group 21 takes in an optical image of a photographic subject so as to form an image on the image pickup element 101. In the AF control mode, a focal adjustment is performed by causing an AF actuator 71M within the interchangeable lens 2 to drive the focusing lens 211 in the direction of the light axis LT.

A focus-drive control portion 71A is configured to generate a drive control signal for the AF actuator 71M for moving the focusing lens 211 to an in-focus position on the basis of an AF control signal received from a main control portion 62 via the lens control portion 26. The AF actuator 71M is formed of, for example, a stepping motor and applies a lens driving force to the lens driving mechanism 24.

The lens driving mechanism 24 is constituted by, for example, a helicoid and a gear (not shown) that rotates the helicoid, and is configured to drive the focusing lens 211 and the like in a direction parallel to the light axis LT by receiving a driving force from the AF actuator 71M. The moving direction and the moving distance of the focusing lens 211 correspond to the rotating direction and the rotating speed of the AF actuator 71M.

The lens-position detecting portion 25 includes an encoding plate having a plurality of code patterns formed at a predetermined pitch in the direction of the light axis LT within the moving range of the lens group 21 and an encoder brush that moves together with the lens group 21 while sliding on the encoding plate, and is configured to detect the moving distance during a focal adjustment of the lens group 21. A lens position detected by the lens driving mechanism 24 is output as, for example, the number of pulses.

The lens control portion 26 is defined by a microcomputer containing, for example, a ROM that stores a control program and a memory, such as a flash memory, that stores data related to status information.

The lens control portion 26 has a communication function for communicating with the main control portion 62 of the camera body 10 via the connector Ec. Thus, the lens control portion 26 can send status-information data related to, for example, a focal length of the lens group 21, an exit-pupil position, the aperture, an in-focus distance, and the amount of ambient light and positional information related to the focusing lens 211 detected by the lens-position detecting portion 25 to the main control portion 62, as well as receive data related to, for example, the driving amount of the focusing lens 211 from the main control portion 62.

The aperture driving mechanism 27 is configured to change the aperture diameter of the aperture stop 23 by receiving a driving force from an aperture drive actuator 76M via the coupler 75.

An electrical configuration of the camera body 10 will now be described. In addition to the aforementioned image pickup element 101 and the shutter unit 40, the camera body 10 includes an analog front-end (AFE) 5, an image processing portion 61, an image memory 614, the main control portion 62, a flash circuit 63, an operating portion 64, and VRAMs 65 (65a and 65b). Moreover, the camera body 10 includes a card interface (I/F) 66, the memory card 67, a communication interface (I/F) 68, a power supply circuit 69, the battery 69B, a shutter drive control portion 73A, a shutter drive actuator 73M, an aperture drive control portion 76A, and the aperture drive actuator 76M.

The image pickup element 101 is defined by, for example, a CMOS color area sensor as mentioned above, and a timing control circuit 51 to be described later controls the image pickup operation, including start (and completion) of an exposure operation of the image pickup element 101, output selection of pixels included in the image pickup element 101, and reading of pixel signals.

The AFE 5 is configured to apply a timing pulse to the image pickup element 101 to cause the image pickup element 101 to perform a predetermined operation and is also configured to perform predetermined signal processing on image signals output from the image pickup element 101 (i.e., a group of analog signals optically received by the pixels of the CMOS area sensor), convert the signals into digital signals, and output the digital signals to the image processing portion 61. This AFE 5 includes the timing control circuit 51, a signal processing portion 52, and an A/D converting portion 53.

The timing control circuit 51 generates a predetermined timing pulse (i.e., a pulse that generates, for example, a vertical scan pulse $\phi$Vn, a horizontal scan pulse $\phi$Vm, and a reset signal $\phi$Vr) on the basis of a reference clock output from the main control portion 62 and outputs the timing pulse to the image pickup element 101 so as to control the image pickup operation of the image pickup element 101. Moreover, the timing control circuit 51 outputs the predetermined timing pulse to the signal processing portion 52 and the A/D converting portion 53 so as to control the operation of the signal processing portion 52 and the A/D converting portion 53.

The signal processing portion 52 is configured to perform predetermined analog signal processing on an analog image signal output from the image pickup element 101. The signal processing portion 52 includes, for example, a correlated double sampling (CDS) circuit, an auto gain control (AGC) circuit, and a clamping circuit. The A/D converting portion 53 is configured to convert analog R, G, and B image signals output from the signal processing portion 52 into digital image signals having multiple bits (for example, 12 bits) on the basis of the timing pulse output from the timing control circuit 51.

The image processing portion 61 is configured to perform image processing on image data output from the AFE 5 to create an image file, and includes a black-level correcting circuit 611, a white-balance control circuit 612, and a gamma correcting circuit 613. The image data taken in by the image processing portion 61 is temporarily written into the image memory 614 in synchronization with the reading of the image pickup element 101. Subsequently, the image data undergoes processing in each block of the image processing portion 61 by accessing the image data written in the image memory 614.

The black-level correcting circuit 611 is configured to correct the black level of each of the R, G, and B digital image signals A/D-converted by the A/D converting portion 53 to a reference black level.

The white-balance control circuit 612 is configured to convert the level (adjust the white balance (WB)) of the digital signals for the R, G, and B color components on the basis of a reference white level according to a light source. Specifically, the white-balance control circuit 612 specifies a section assumed to be white in the original photographic subject from brightness and chromatic data in the photographic subject on the basis of WB adjustment data received from the main control portion 62, determines an average of the R, G, and B color components in the aforementioned section, a G/R ratio, and a G/B ratio, and corrects the level of these values as R and B correction gains.

The gamma correcting circuit 613 is configured to correct the gradation characteristics of the WB-adjusted image data. Specifically, the gamma correcting circuit 613 performs non-linear conversion and an offset adjustment on the level of the image data using a gamma correction table preliminarily set for each color component.

The image memory 614 is used for temporarily storing image data output from the image processing portion 61 during the photographic shooting mode and is also used as a work area where the main control portion 62 performs predetermined processing on the image data. During the reproduction mode, the image memory 614 is used for temporarily storing image data read out from the memory card 67.

The main control portion 62 is defined by a microcomputer containing, for example, a ROM that stores a control program and a storage portion, such as a RAM, that temporarily stores data, and is configured to control the operation of each portion of the image pickup device 1.

The flash circuit 63 is configured to control the amount of light to be emitted from an external flashlight, connected to the flash portion 318 or the connection terminal portion 319, in a flash shooting mode to a value set by the main control portion 62.

The operating portion 64 includes the mode setting dial 305, the control-value setting dial 306, the shutter button 307, the setting-button group 312, the cross keypad 314, the push button 315, and the main switch 317, and is provided for inputting operational information to the main control portion 62.

The VRAMs 65a and 65b each have an image-signal storage capacity in correspondence to the number of pixels in the LCD 311 and the EVF 316 and serve as a buffer memory between the main control portion 62 and the LCD 311 and the EVF 316. The card I/F 66 is an interface for sending and receiving signals between the memory card 67 and the main control portion 62. The memory card 67 is a storage medium for storing image data generated by the main control portion 62. The communication I/F 68 is an interface for transmitting, for example, image data to a personal computer or other external devices.

The power supply circuit 69 is formed of, for example, a constant voltage circuit and is configured to generate a voltage for driving the entire image pickup device 1, including a control portion, such as the main control portion 62, the image pickup element 101, and other various kinds of driving portions. The electricity to be applied to the image pickup element 101 is controlled by a control signal applied to the power supply circuit 69 from the main control portion 62. The battery 69B is formed of a primary battery, such as an alkaline battery, or a secondary battery, such as a nickel-hydride rechargeable battery, and serves as a power source for supplying power to the entire image pickup device 1.

The shutter drive control portion 73A is configured to generate a drive control signal for the shutter drive actuator 73M on the basis of a control signal received from the main control portion 62. The shutter drive actuator 73M is configured to open and close the shutter unit 40.

The aperture drive control portion 76A is configured to generate a drive control signal for the aperture drive actuator 76M on the basis of a control signal received from the main control portion 62. The aperture drive actuator 76M applies a driving force to the aperture driving mechanism 27 via the coupler 75.

The camera body 10 includes a phase-difference AF calculation circuit 77 configured to perform a calculation necessary when performing AF control using the image pickup element 101 on the basis of image data, having undergone black-level correction, output from the black-level correcting circuit 611.

A phase-difference AF operation of the image pickup device 1 using the phase-difference AF calculation circuit 77 will now be described.

Phase-Difference AF Operation of Image Pickup Device 1

The image pickup device 1 is capable of performing focus detection (phase-difference AF operation) based on a phase-difference detection method by optically receiving light transmitted through sections with different exit pupils in the image pickup element 101. The following description will be directed to the configuration of the image pickup element 101 and to the principle of a phase-difference AF operation using the image pickup element 101.

Figure 5:
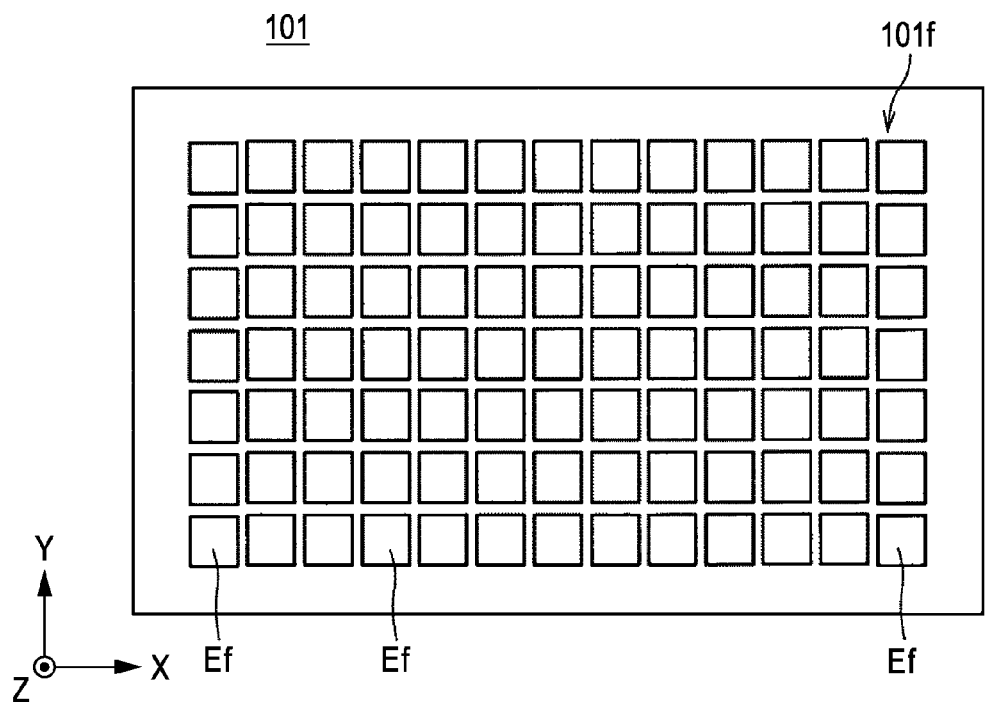
FIG. 5 is a diagram for explaining the configuration of an image pickup element.
Figure 6:
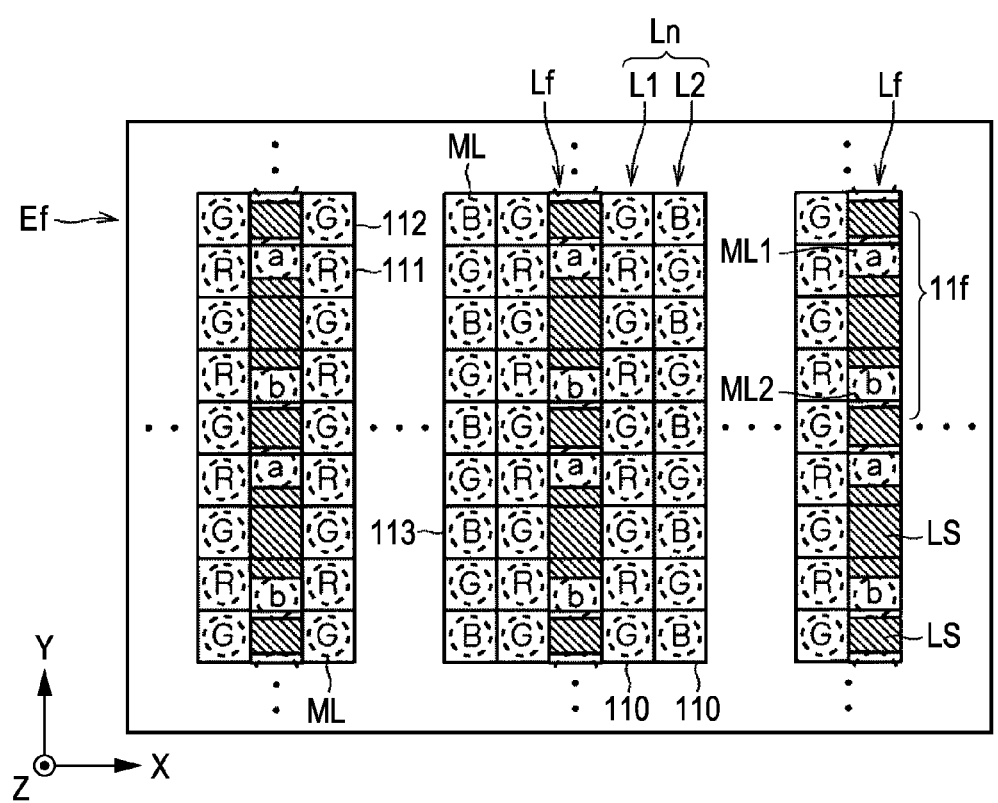
FIG. 6 is another diagram for explaining the configuration of the image pickup element.

FIGS. 5 and 6 are diagrams for explaining the configuration of the image pickup element 101.

In the image pickup element 101, focus detection based on a phase-difference detection method is possible in each of AF areas Ef arranged in a matrix on an image pickup face 101f of the image pickup element 101 (FIG. 5).

Each AF area Ef is provided with normal pixels 110 including R pixels 111, G pixels 112, and B pixels 113 in which R, G, and B color filters, respectively, are disposed between photodiodes and micro-lenses ML (denoted by dash lines) functioning as condensing lenses. On the other hand, as shown in FIG. 6, each AF area Ef is also provided with AF lines Lf. In each AF line Lf, AF sensor portions 11f are arranged along a vertical line (vertical direction) of the image pickup element 101. The AF sensor portions 11f each achieve a pupil segmentation function by using a pair of micro-lenses ML1 and ML2 and photoelectric conversion portions PD1 and PD2 (see FIG. 9) for performing a phase-difference AF operation.

Each AF area Ef also has vertical lines Ln of normal pixels 110 (also referred to as "normal pixel lines") not having the aforementioned pupil segmentation function. The normal pixel lines Ln include Gr lines L1 in which G pixels 112 and R pixels 111 are alternately arranged in the vertical direction and Gb lines L2 in which B pixels 113 and G pixels 112 are alternately arranged in the vertical direction. The Gr lines L1 and the Gb lines L2 are alternately arranged in the horizontal direction so that a Bayer arrangement is formed by the normal pixels 110. In each AF area Ef, image information of a photographic subject is basically acquired by the normal pixel lines Ln with a larger number of lines than the AF lines Lf.

Furthermore, in each AF area Ef, the AF lines Lf in which the AF sensor portions 11f each having two micro-lenses ML1 and ML2 with the same configuration (radius and curvature) as the micro-lenses ML of the normal pixels 110 are repetitively arranged in the vertical direction are formed periodically in the horizontal direction. Normal pixel lines Ln (for example, four or more normal pixel lines Ln) serving as a complement to missing image information of a photographic subject on the AF lines Lf are preferably provided between AF lines Lf that are next to each other in the horizontal direction. A combination of two normal pixel lines Ln adjacent to the left and right sides of each AF line Lf may be defined by vertical lines of the same kind (two Gr lines L1 or two Gb lines L2) or may be defined by vertical lines of different kinds (one being a Gr line L1 and the other being a Gb line L2).

Before describing the difference between the normal pixels 110 and the AF sensor portions 11f, the configuration of the normal pixels 110 will be described first.

Figure 7:
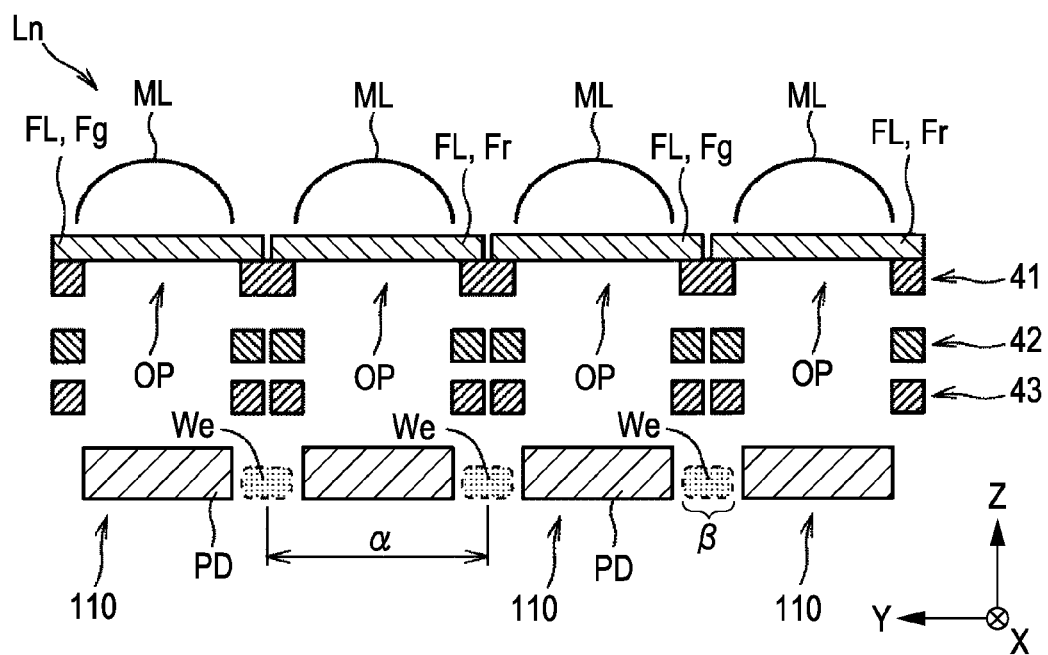
FIG. 7 is a vertical sectional view for explaining the configuration of normal pixels.

FIG. 7 is a vertical sectional view for explaining the configuration of the normal pixels 110. An array of the normal pixels 110 shown in FIG. 7 corresponds to a Gr line L1 (FIG. 6), which is a normal pixel line Ln formed along the vertical direction (Y direction).

Figure 8:
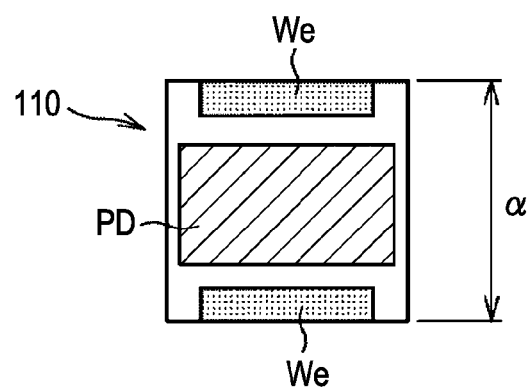
FIG. 8 is a plan view for explaining the configuration of the normal pixels.

In each normal pixel line Ln, photoelectric conversion portions (photodiodes) PD provided for the respective normal pixels 110 are arranged at a pitch α along the vertical direction (Y direction). In each of the normal pixels 110 having a pitch α as a length (width) in the Y direction, for example, wiring areas We each having a wiring pattern as an electric circuit are provided adjacent to upper and lower edges, as shown in FIG. 8, and a photoelectric conversion portion PD having a rectangular shape in plan view is provided. This rectangular photoelectric conversion portion PD is disposed such that its longitudinal direction is aligned with the horizontal direction, or in other words, its lateral direction is aligned with the vertical direction. In addition, as shown in FIG. 7, the neighboring photoelectric conversion portions PD have a fixed gap β therebetween for ensuring the wiring areas We. This gap β is similarly provided between the neighboring photoelectric conversion portions PD in an AF line Lf (see FIG. 9) in which the photoelectric conversion portions PD are arranged in the vertical direction. Specifically, in the image pickup face 101f serving as a light-receiving portion, a vertical array (vertical line) in which photoelectric conversion portions PD are arranged in the vertical direction (first direction) at a pitch α with the gaps β maintained therebetween is provided in a plurality in the horizontal direction (second direction) orthogonal to the vertical direction, thereby forming a matrix arrangement of photoelectric conversion portions PD.

The micro-lenses ML are provided above the respective photoelectric conversion portions PD in the image pickup face 101f. The micro-lenses ML and the photoelectric conversion portions PD have three metallic layers therebetween, specifically, a first metallic layer 41, a second metallic layer 42, and a third metallic layer 43 in that order from the top. The second metallic layer 42 and the third metallic layer 43 have light-blocking properties and serve as wires (linear members) for transferring electric signals. The second metallic layer 42 and the third metallic layer 43 are disposed along the horizontal direction (X direction) (the wires are disposed along the normal of the plane of drawing in FIG. 7). The first metallic layer 41 serves as a grounding surface for the two metallic layers. Color filters FL are disposed on the first metallic layer 41, and the micro-lenses ML are provided on the color filters FL. Regarding the color filters FL in, for example, an array of normal pixels 110 arranged in a Gr line L1, green filters Fg and red filters Fr are alternately arranged, as shown in FIG. 7.

In order to prevent the photoelectric conversion portions PD from receiving unnecessary light passing through between the micro-lenses ML, the spaces between the micro-lenses ML in each normal pixel line Ln are optically blocked by the first metallic layer 41. In other words, the first metallic layer 41 functions as a layer of a light-blocking mask having, for example, octagonal openings OP directly below the micro-lenses ML.

The configuration of the AF sensor portions 11f will now be described.

Figure 9:
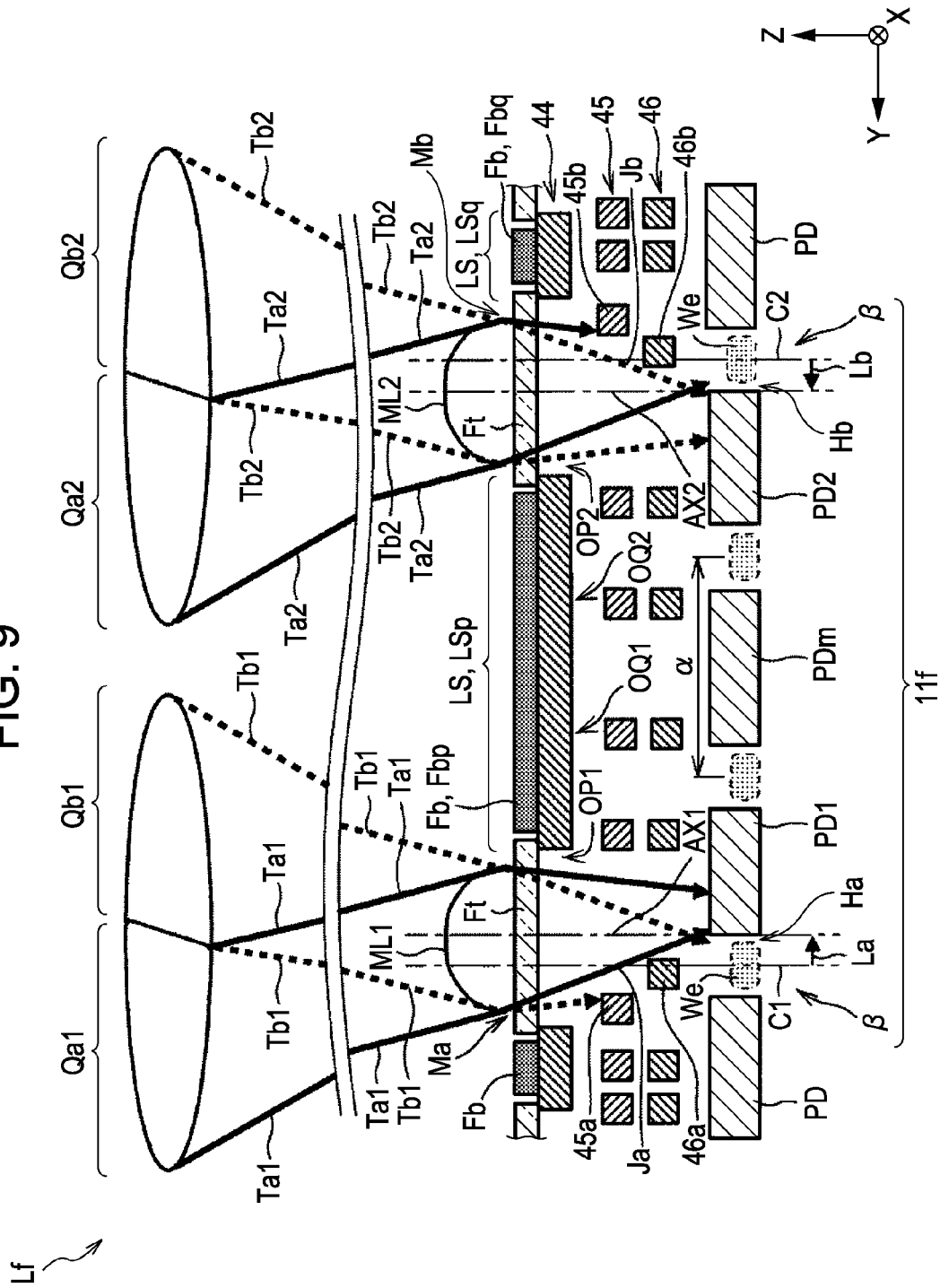
FIG. 9 is a vertical sectional view for explaining the configuration of an AF sensor portion.
Figure 10:
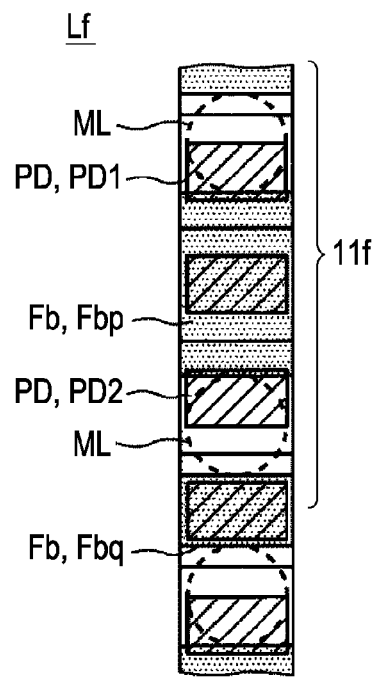
FIG. 10 is a plan view for explaining the configuration of the AF sensor portion 11f.

FIGS. 9 and 10 are a vertical sectional view and a plan view, respectively, for explaining the configuration of one of the AF sensor portions 11f. The AF sensor portion 11f shown in FIGS. 9 and 10 is provided on one of the AF lines Lf (FIG. 6).

As shown in FIG. 9, the AF sensor portion 11f includes a photoelectric conversion portion PD1 that optically receives a light beam Ta1 in an upper segment Qa1 of an exit pupil when the interchangeable lens 2 is viewed through an upper (+Y direction side) micro-lens ML1, and a photoelectric conversion portion PD2 that optically receives a light beam Tb2 in a lower segment Qb2 of an exit pupil when the interchangeable lens 2 is viewed through a lower (−Y direction side) micro-lens ML2. These two photoelectric conversion portions PD1 and PD2 have one photoelectric conversion portion PDm disposed therebetween. Similar to the aforementioned normal pixel line Ln (FIG. 7), since the neighboring photoelectric conversion portions PD have a gap β therebetween, the micro-lenses ML are arranged in view of the gaps β. In detail, in the AF sensor portion 11f, a light axis AX1 of the micro-lens ML1 is aligned with an upper edge Ha of the photoelectric conversion portion PD1, and a light axis AX2 of the micro-lens ML2 is aligned with a lower edge Hb of the photoelectric conversion portion PD2. In other words, the light axis AX1 of the micro-lens ML1 is disposed at a position shifted by a predetermined shift distance La from a center line C1 of a gap β between the photoelectric conversion portion PD1 and an upper neighboring photoelectric conversion portion PD. On the other hand, the light axis AX2 of the micro-lens ML2 is disposed at a position shifted by a predetermined shift distance Lb from a center line C2 of a gap β between the photoelectric conversion portion PD2 and a lower neighboring photoelectric conversion portion PD. The AF sensor portion 11f having such a configuration allows for exit-pupil segmentation by the two photoelectric conversion portions PD1 and PD2 optically receiving the light beams Ta1 and Tb2 passing through the micro-lenses ML1 and ML2, respectively.

In each of the AF lines Lf in which the aforementioned AF sensor portions 11f are arranged, the components disposed above the photoelectric conversion portions PD, namely, the first to third metallic layers, the color filters, and the micro-lenses, are shifted, relative to the normal pixel lines Ln shown in FIG. 7, by half a pitch (α/2) in the vertical direction (Y direction), and the pairs of micro-lenses are also shifted inward. For example, regarding each pair of micro-lenses ML1 and ML2, the light axes AX1 and AX2 thereof are respectively aligned with the center lines C1 and C2 of the gaps β by shifting the light axes AX1 and AX2, relative to the normal pixel lines Ln, by half a pitch, and the light axes AX1 and AX2 are subsequently shifted by the shift distances La and Lb (inward) toward the photoelectric conversion portion PDm in the middle.

Specifically, the arrangement relationship between the two photoelectric conversion portions PD1 and PD2 and the two micro-lenses ML1 and ML2 in each AF sensor portion 11f is equivalent to an arrangement configuration obtained by relatively shifting specific micro-lenses ML in a normal pixel line Ln that correspond to the micro-lenses ML1 and ML2 in the AF sensor portion 11f by half a pitch α in the vertical direction relative to the photoelectric conversion portions PD, and then shifting the aforementioned micro-lenses ML further inward by the predetermined shift distances La and Lb. The reason the micro-lenses are shifted further by the predetermined shift distances La and Lb is that, if the micro-lenses were to be shifted only by half a pitch, the photographic-subject light passing through near the center of each exit pupil would enter the wiring areas We, thus lowering the amount of light to be received by the photoelectric conversion portions PD1 and PD2 related to pupil segmentation. In the arrangement configuration described above, a light-blocking section LS (LSp) is provided between each pair of neighboring micro-lenses ML1 and ML2, thereby forming an array (AF line Lf) of AF sensor portions 11f. Neighboring AF sensor portions 11f in each AF line Lf have a light-blocking section LSq provided therebetween, whose width in the vertical direction (Y direction) is smaller than that of the light-blocking section LSp. In this manner, the AF lines Lf can be formed by slightly changing the design of the normal pixel lines Ln, thereby simplifying and facilitating the design and manufacture of the AF lines Lf. The following is a detailed description of a light-blocking section LS provided between neighboring micro-lenses ML in each AF line Lf.

In each AF line Lf, a first metallic layer 44 blocks light at the light-blocking sections LSp, as shown in FIG. 9, relative to the openings OP (FIG. 7) in the first metallic layer 41 formed in the normal pixel lines Ln. In detail, two sections OQ1 and OQ2 (FIG. 9) corresponding to where the openings OP in the normal pixel line Ln shown in FIG. 7 are formed are blocked by the first metallic layer 44, and a black color filter (black filter) Fbp having a width equivalent to about two pixels is placed on the first metallic layer 44. The black filter Fbp is placed on the first metallic layer 44 in this manner to minimize the occurrence of ghost flare. Specifically, if the upper surface of the first metallic layer 44 is exposed, light entering from the interchangeable lens 2 is reflected by the first metallic layer 44 so as to cause ghost flare to occur. Therefore, the black filter Fbp is used to absorb this reflection light. By blocking light in each light-blocking section LSp using the black filter Fbp and the first metallic layer 44, the light can be blocked properly and readily. In each light-blocking section LSq between neighboring AF sensor portions 11f, a black filter Fbq having a width smaller than that of one pixel is disposed. As a result, in each AF line Lf, black filters Fbp having a relatively large width and black filters Fbq having a relatively small width are alternately and repetitively arranged, as shown in FIG. 10.

Furthermore, in each AF line Lf, transparent filters Ft are employed as color filters provided above openings OP1 and OP2 in the first metallic layer 44. This allows for an increase in the amount of light to be received by each AF sensor portion 11f, thereby achieving higher sensitivity.

In each AF sensor portion 11f, upper wiring sections 45a and 46a of a second metallic layer 45 and a third metallic layer 46, which are closest to the light axis AX1 of the micro-lens ML1, are positioned closer towards the light axis AX1 so as to prevent a light beam Tb1 from a lower segment Qb1 of the exit pupil from entering the wiring areas We as much as possible. Likewise, lower wiring sections 45b and 46b of the second metallic layer 45 and the third metallic layer 46, which are closest to the light axis AX2 of the micro-lens ML2, are positioned closer towards the light axis AX2 so as to prevent a light beam Ta2 from a upper segment Qa2 of the exit pupil from entering the wiring areas We as much as possible. In other words, the wiring sections 45a, 45b, 46a, and 46b arranged along the horizontal direction (X direction) are provided near the outer side, in the Y direction, of a line segment Ja (arrow with a solid line) and the outer side, in the Y direction, of a line segment Jb (arrow with a dotted line), as shown in FIG. 9. Specifically, the line segments Ja and Jb respectively connect farthest ends of the micro-lenses ML1 and ML2 shown in FIG. 9, which are the farthest ends from each other in the vertical direction (Y direction), that is, an upper end Ma and a lower end Mb, with the edges Ha and Hb of the photoelectric conversion portions PD1 and PD2. The wiring sections 45a, 45b, 46a, and 46b are arranged in this manner to minimize an adverse effect on pupil segmentation. Specifically, if light incident on the wiring areas We is reflected by the wiring areas We, this reflection light may be optically received by the photoelectric conversion portions PD1 and PD2, possibly causing an adverse effect on pupil segmentation. In addition to the wiring sections 45a, 45b, 46a, and 46b, dummy wiring sections for minimizing incident light on the wiring areas We may be provided.

With the AF sensor portion 11f having the above configuration, the light beam Ta1 from a pupil segment of the exit pupil, that is, the upper segment Qa1 of the exit pupil, travels through the micro-lens ML1 and the transparent color filter Ft so as to be optically received by the photoelectric conversion portion PD1, and the light beam Tb2 from the lower segment Qb2 of the exit pupil travels through the micro-lens ML2 and the filter Ft so as to be optically received by the photoelectric conversion portion PD2. In other words, in a matrix arrangement of photoelectric conversion portions PD formed in the image pickup face 101f, a specific vertical array, that is, each AF line Lf, is provided with pairs of photoelectric conversion portions PD1 and PD2. The photoelectric conversion portions PD1 and PD2 of each pair optically receive, via the pair of micro-lenses ML1 and ML2, the light beams Ta1 and Tb2 of a photographic subject passing through the upper segment Qa1 and the lower segment Qb2, which are a pair of segmental regions disposed biasedly in opposite directions from each other in the vertical direction in the exit pupil of the interchangeable lens 2.

In the following description, optical reception data obtained in a photoelectric conversion portion PD1 will be referred to as "a-series data", whereas optical reception data obtained in a photoelectric conversion portion PD2 will be referred to as "b-series data". For example, the principle of a phase-difference AF will be described below with reference to FIGS. 11 to 15 showing a-series data and b-series data obtained from a group of AF sensor portions 11f arranged in a certain AF line Lf (FIG. 6).

Figure 11:
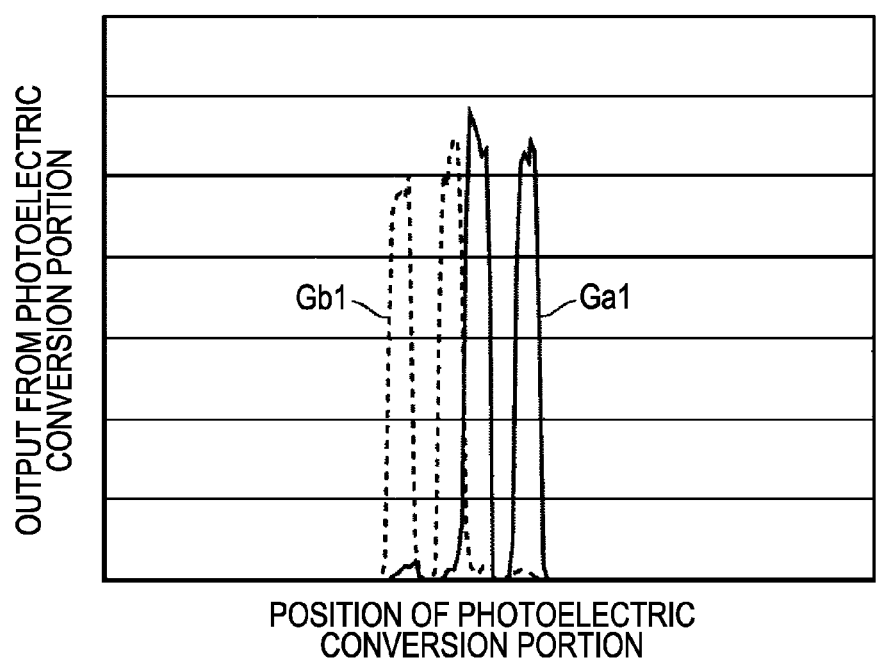
FIG. 11 illustrates a simulation result obtained when a focal plane is defocused towards the near side by 200 μm from an image pickup face of the image pickup element.
Figure 12:
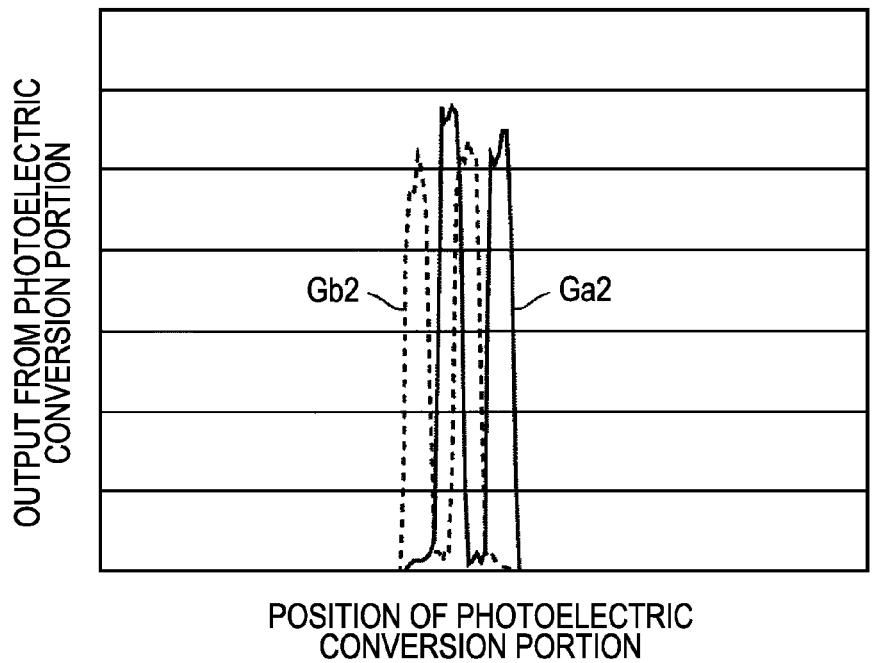
FIG. 12 illustrates a simulation result obtained when the focal plane is defocused towards the near side by 100 μm from the image pickup face.
Figure 13:
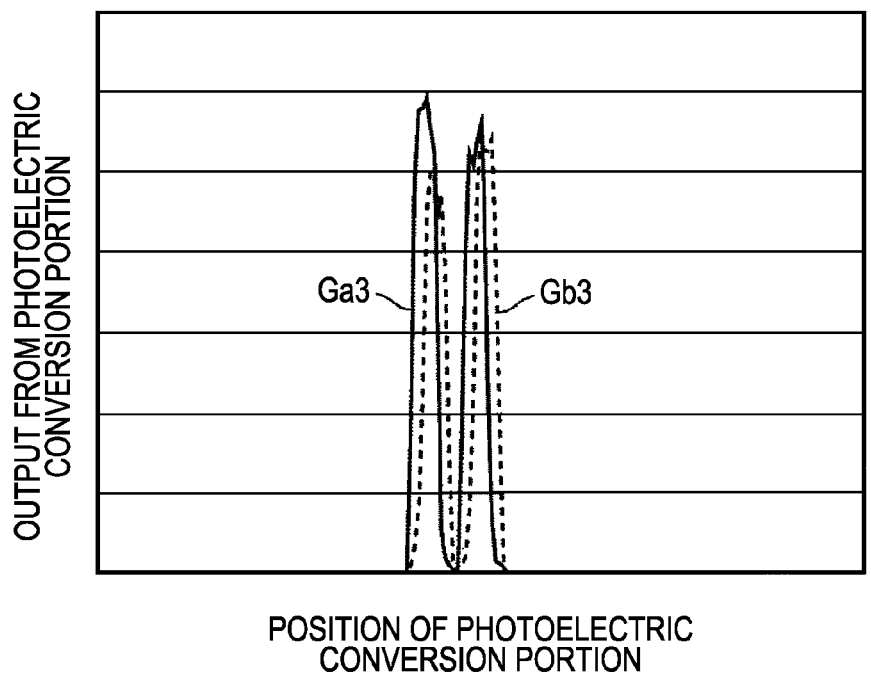
FIG. 13 illustrates a simulation result of an in-focus state in which the focal plane accords with the image pickup face.
Figure 14:
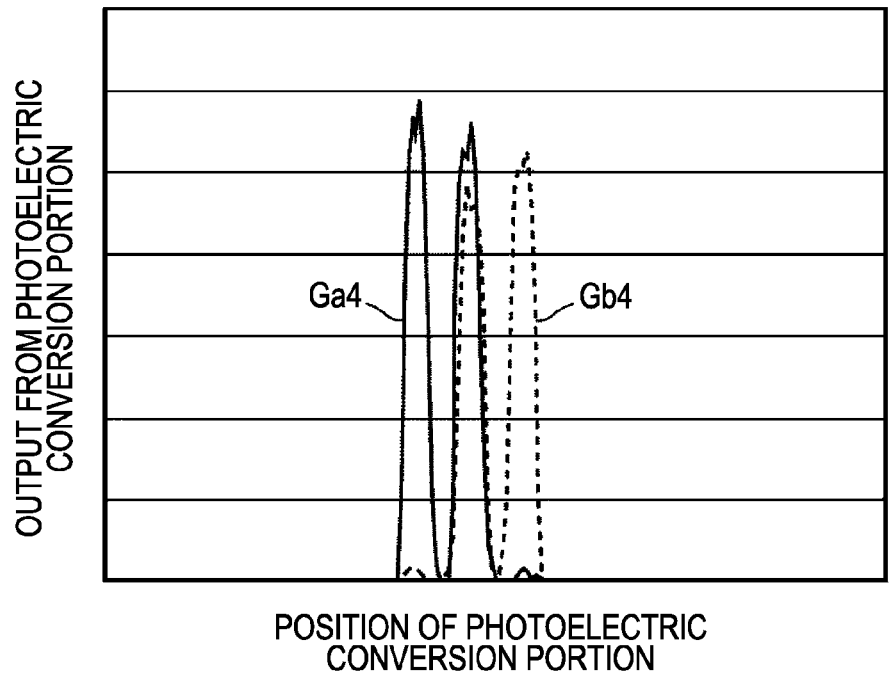
FIG. 14 illustrates a simulation result obtained when the focal plane is defocused towards the far side by 100 μm from the image pickup face.
Figure 15:
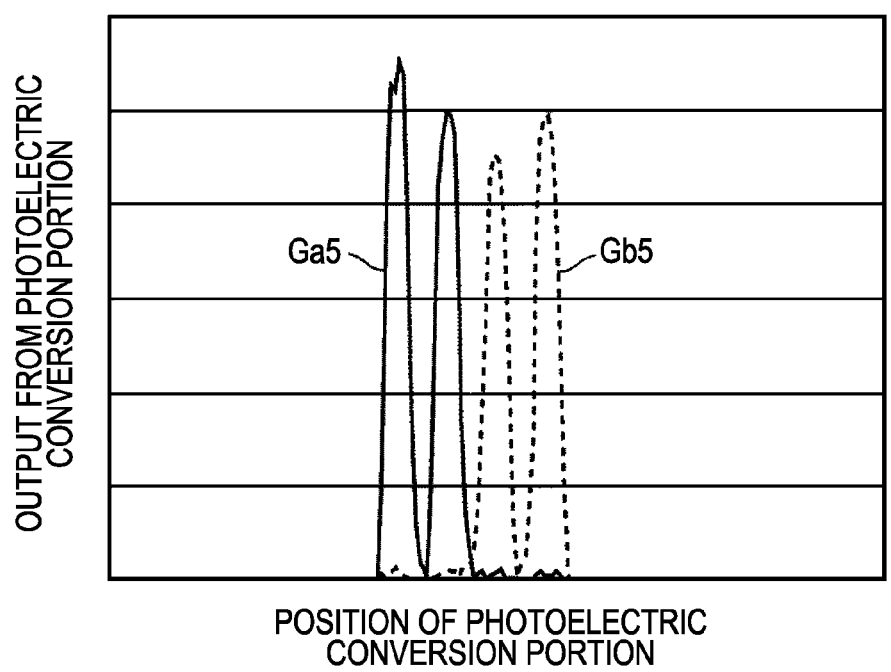
FIG. 15 illustrates a simulation result obtained when the focal plane is defocused towards the far side by 200 μm from the image pickup face.

FIG. 11 illustrates a simulation result obtained when the focal plane is defocused towards the near side by 200 µm from the image pickup face 101f of the image pickup element 101. FIG. 12 illustrates a simulation result obtained when the focal plane is defocused towards the near side by 100 µm from the image pickup face 101f. FIG. 13 illustrates a simulation result of an in-focus state in which the focal plane accords with the image pickup face 101f. FIG. 14 illustrates a simulation result obtained when the focal plane is defocused towards the far side by 100 µm from the image pickup face 101f. FIG. 15 illustrates a simulation result obtained when the focal plane is defocused towards the far side by 200 µm from the image pickup face 101f. In FIGS. 11 to 15, the abscissa axis represents the position of the photoelectric conversion portions PD1 and PD2 in the AF-line-Lf direction, whereas the ordinate axis represents an output from the photoelectric conversion portions PD1 and PD2. In FIGS. 11 to 15, graphs Ga1 to Ga5 (shown with solid lines) each represent a-series data, whereas graphs Gb1 to Gb5 (shown with dotted lines) each represent b-series data.

When comparing a-series image sequences represented by a-series graphs Ga1 to Ga5 in FIGS. 11 to 15 with b-series image sequences represented by b-series graphs Gb1 to Gb5, it is apparent that a shift amount (displacement amount) occurring in the AF-line-Lf direction (vertical direction) between an a-series image sequence and a b-series image sequence increases with increasing defocus amount.

Figure 16:
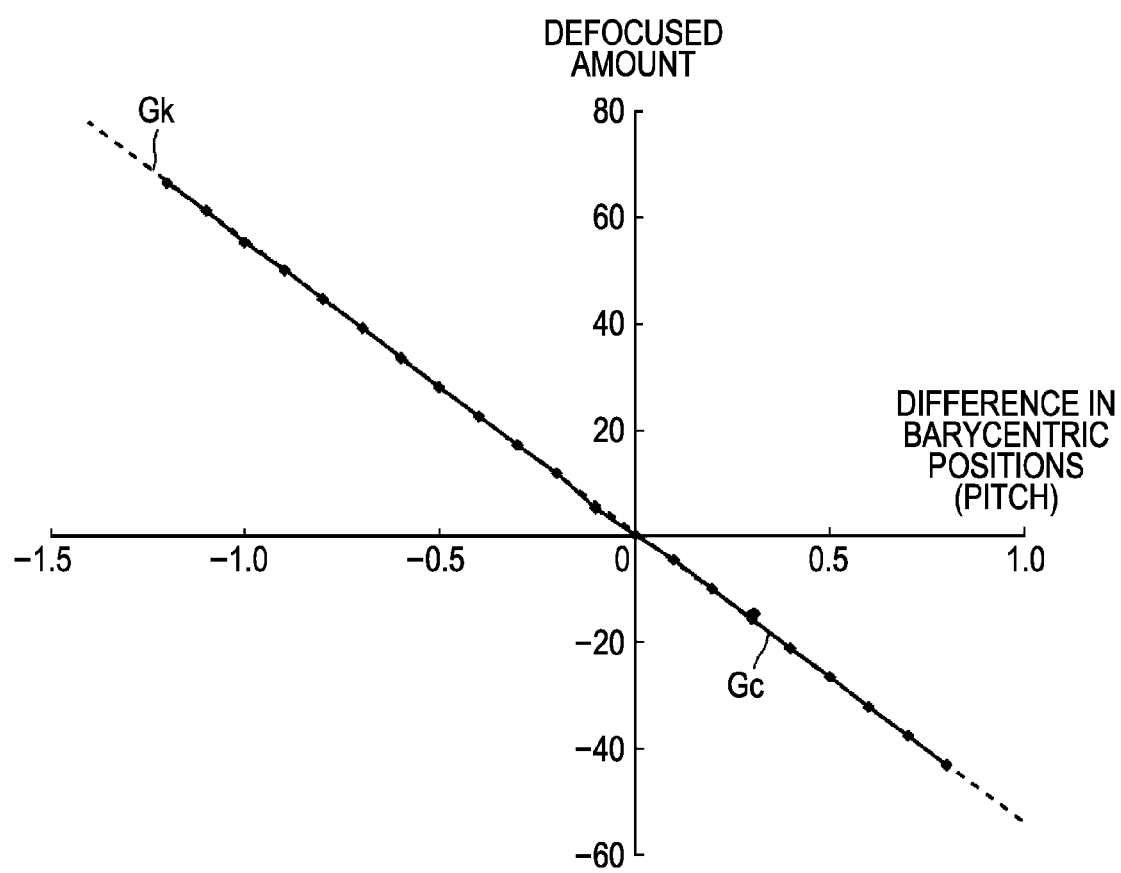
FIG. 16 is a diagram for explaining a graph Gc showing the relationship between a difference in barycentric positions between a pair of image sequences and a defocus amount.

When the relationship between a shift amount between a pair of image sequences (i.e., a-series image sequence and b-series image sequence) and a defocus amount is made into a graph, a graph Gc shown in FIG. 16 is obtained. In FIG. 16, the abscissa axis represents a difference (pixel pitch) between a barycentric position of an a-series image sequence and a barycentric position of a b-series image sequence, whereas the ordinate axis represents a defocus position (μm). A barycentric position $X_g$ of each image sequence can be determined by, for example, the following equation (1):

$$X_g = \frac{X_1 Y_1 + X_2 Y_2 + \ldots + X_n Y_n}{Y_1 + Y_2 + \ldots + Y_n} \quad (1)$$

In the equation (1), $X_1$ to $X_n$ each denote, for example, the position of the photoelectric conversion portions PD1 and PD2 from the upper end of the corresponding AF line Lf, whereas $Y_1$ to $Y_n$ each denote an output value from the photoelectric conversion portion PD1 or PD2 at each of the positions $X_1$ to $X_n$.

As shown in the graph Gc in FIG. 16, a difference in barycentric positions of a pair of image sequences and a defocus amount have a proportional relationship. This relationship can be expressed by the following equation (2) in which the defocus amount is denoted by DF (μm) and the difference in barycentric positions is denoted by C (μm).

$$DF = k \times C \quad (2)$$

In the equation (2), a coefficient k represents a gradient Gk (shown with a dotted line) with respect to the graph Gc in FIG. 16 and can be preliminarily obtained from, for example, factory tests.

Accordingly, after using the phase-difference AF calculation circuit 77 to determine a difference in barycentric positions (phase difference) related to a-series data and b-series data obtained by an AF sensor portion 11f, a defocus amount is calculated using the equation (2). By applying a driving amount equivalent to the calculated defocus amount to the focusing lens 211, automatic-focus (AF) control for moving the focusing lens 211 to a detected focal position can be performed. The relationship between the aforementioned defocus amount and the driving amount for the focusing lens 211 is uniquely determined on the basis of a design value of the interchangeable lens 2 fitted to the camera body 10.

In the image pickup device 1, the image pickup element 101 is provided with the AF sensor portions 11f for a phase-difference AF operation and each including a pair of photoelectric conversion portions PD1 and PD2 with the same size as the photoelectric conversion portions PD in the normal pixel lines Ln, a pair of micro-lenses ML1 and ML2, and a first metallic layer 44 having openings OP1 and OP2 with about the same size as the micro-lenses ML1 and ML2 directly below the micro-lenses ML1 and ML2. Thus, the image pickup element (that is, an image pickup element having a phase-difference detecting function) 101 is capable of accurately performing focus detection based on a phase-difference detection method and can also be manufactured satisfactorily even as pixels become miniaturized. As compared with an image pickup element having a phase-difference detecting function discussed in Japanese Unexamined Patent Application Publication No. 2005-303409 in which pupil segmentation is implemented by limiting photographic-subject light using small openings in a metallic layer (light-blocking mask), blockage of necessary light beams can be minimized in this embodiment, thereby reducing degradation of the sensitivity of the photoelectric conversion portions PD1 and PD2. Furthermore, in the image pickup element having a phase-difference detecting function discussed in Japanese Unexamined Patent Application Publication No. 2005-303409, since the metallic layer having the small openings are projected from above the photoelectric conversion portions and are thus exposed, the exposed metallic layer can possibly cause ghost flare to occur. In contrast, since black filters Fb are disposed on the first metallic layer 44 in the image pickup element 101 according to this embodiment, the occurrence of ghost flare can be prevented.

The micro-lenses ML1 and ML2 in each AF sensor portion 11f are disposed such that the respective light axes AX1 and AX2 thereof extend through the edges Ha and Hb, which are the farthest edges from each other in the vertical direction (Y direction), of the photoelectric conversion portions PD1 and PD2, as shown in FIG. 9. As a result, even if the photoelectric conversion portions PD are disposed with a gap β therebetween in the corresponding AF line Lf to ensure the wiring areas We, light beams traveling through near the center of the exit pupils can be optically received by the photoelectric conversion portions PD1 and PD2, thereby minimizing output reduction of the photoelectric conversion portions PD1 and PD2 and allowing for a highly reliable phase-difference AF operation.

Since the photoelectric conversion portions PD1 and PD2 in each AF sensor portion 11f are two neighboring photoelectric conversion portions PD with one photoelectric conversion portion PDm disposed therebetween in the corresponding AF line Lf, as shown in FIG. 9, the AF sensor portion 11f can be properly formed even with a pixel line of the image pickup element 101 in which the photoelectric conversion portions PD are arranged with the gap β maintained therebetween. When different AF lines (sometimes referred to as "second AF lines" hereinafter) extending in a different direction, for example, the horizontal direction (X direction), from that of the AF lines Lf (sometimes referred to as "first AF lines" hereinafter) are provided, the aforementioned photoelectric conversion portions PDm may be disposed at the intersections between the first AF lines and the second AF lines so that a continuous line output can be attained without having to divide the AF lines.

Modifications

Figure 17:
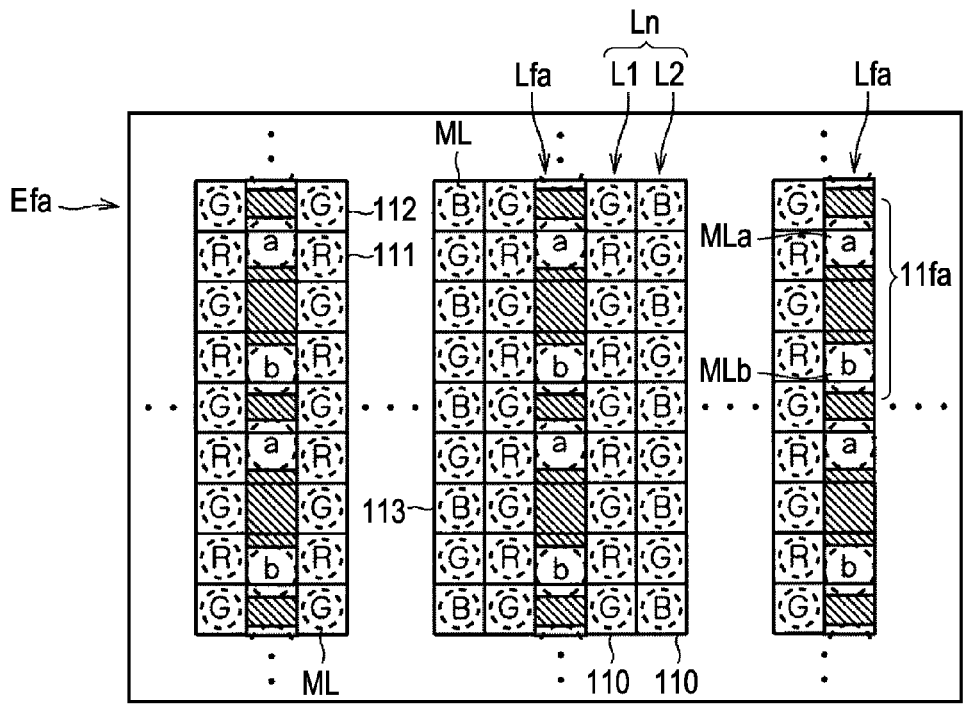
FIG. 17 is a diagram for explaining the configuration of an AF area according to a modification of the embodiment of the present invention.

As an alternative to the above embodiment that employs the AF areas Ef having the AF lines Lf including the micro-lenses ML1 and ML2 with the same configuration as those in the normal pixels 110, as shown in FIG. 6, AF areas Efa having AF lines Lfa that include micro-lenses MLa and MLb with a larger diameter than that of the micro-lenses in the normal pixels 110, as shown in FIG. 17, may be employed. In that case, the first metallic layer 44 is provided with openings with dimensions set in accordance with the diameter of the micro-lenses MLa and MLb, specifically, openings somewhat larger than the openings OP1 and OP2 shown in FIG. 9. With these micro-lenses MLa and MLb (and the openings in the first metallic layer 44), the sensitivity of AF sensor portions 11fa in the AF lines Lfa can be enhanced.

Figure 18:
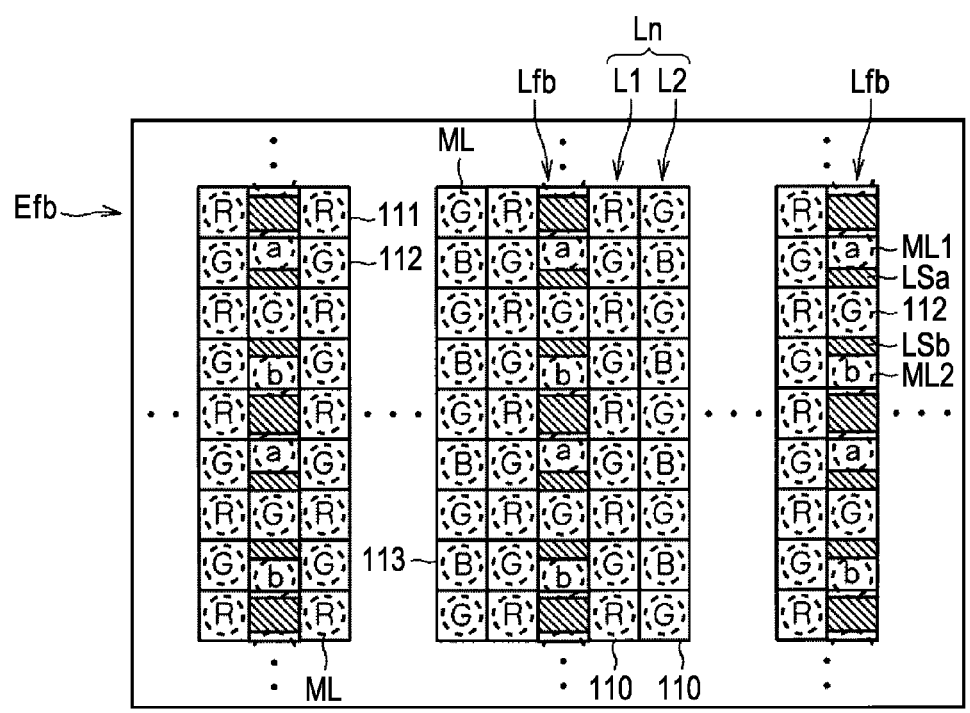
FIG. 18 is a diagram for explaining the configuration of an AF area according to another modification of the embodiment of the present invention.

As an alternative to the above embodiment that employs the AF areas Ef having the AF lines Lf including the light-blocking sections LS each occupying the entire area between each pair of micro-lenses ML1 and ML2 separated from each other by a distance equivalent to one pixel or more, as shown in FIG. 6, AF areas Efb with AF lines Lfb each having a normal pixel 110, such as a G pixel 112, interposed between a pair of micro-lenses ML1 and ML2, as shown in FIG. 18, may be employed. In that case, light-blocking sections LSa and LSb are formed in areas between a pair of micro-lenses ML1 and ML2 and a normal pixel 110. With this configuration, missing image information of a photographic subject in the AF lines can be reduced by the normal pixels 110 interposed in the AF lines Lfb, and improved image quality can be achieved by a complementation process using image information acquired by these normal pixels 110.

Figure 19:
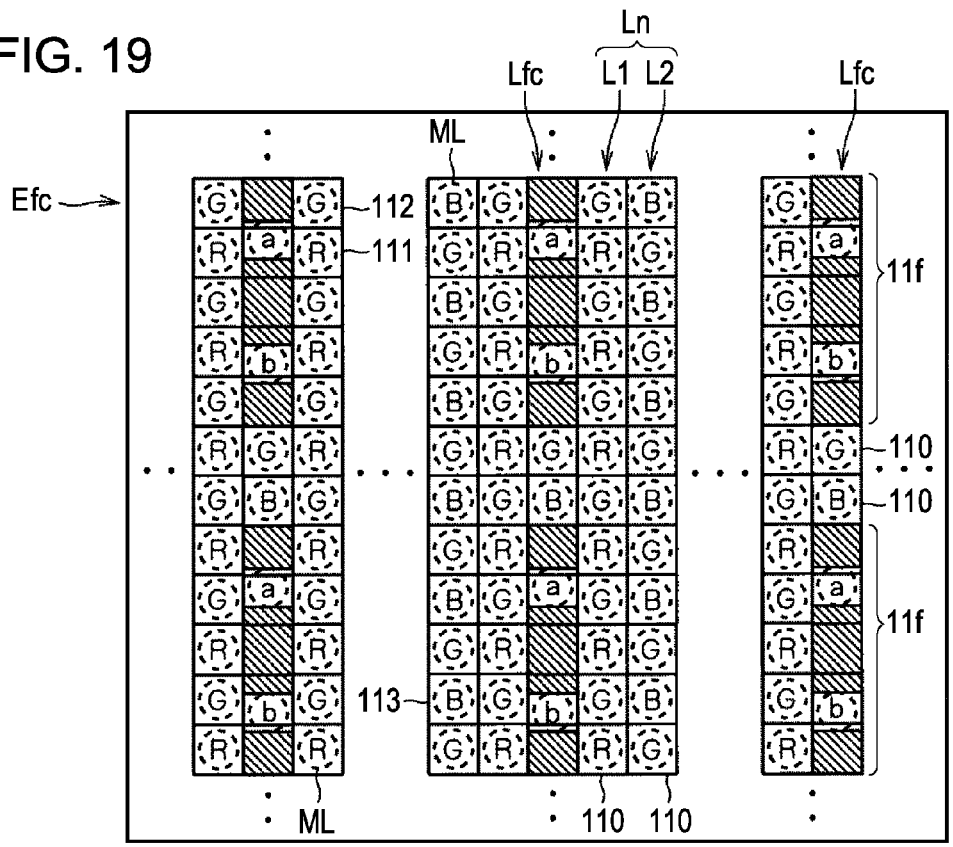
FIG. 19 is a diagram for explaining the configuration of an AF area according to another modification of the embodiment of the present invention.

As an alternative to the above embodiment that employs the AF areas Ef having the AF lines Lf constituted only by the AF sensor portions 11f, as shown in FIG. 6, AF areas Efc having AF lines Lfc in which normal pixels 110 are interposed between neighboring AF sensor portions 11f, as shown in FIG. 19, may be employed. In that case, image information of the normal pixels 110 in the AF lines Lfc can be used as a complement to missing image information of a photographic subject in the AF sensor portions 11f, thereby achieving improved image quality.

Figure 20:
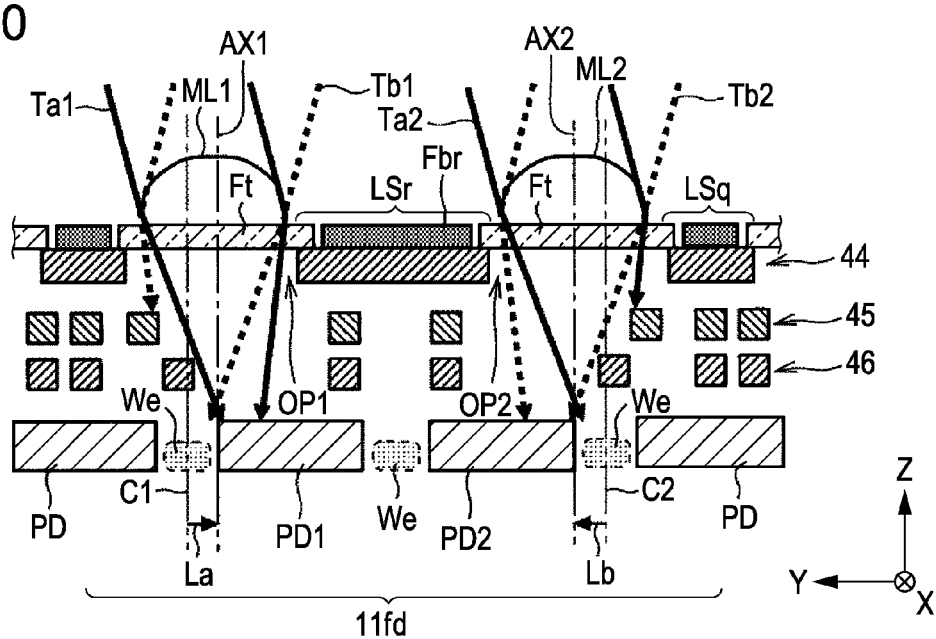
FIG. 20 is a diagram for explaining the configuration of an AF sensor portion according to a modification of the embodiment of the present invention.
Figure 21:
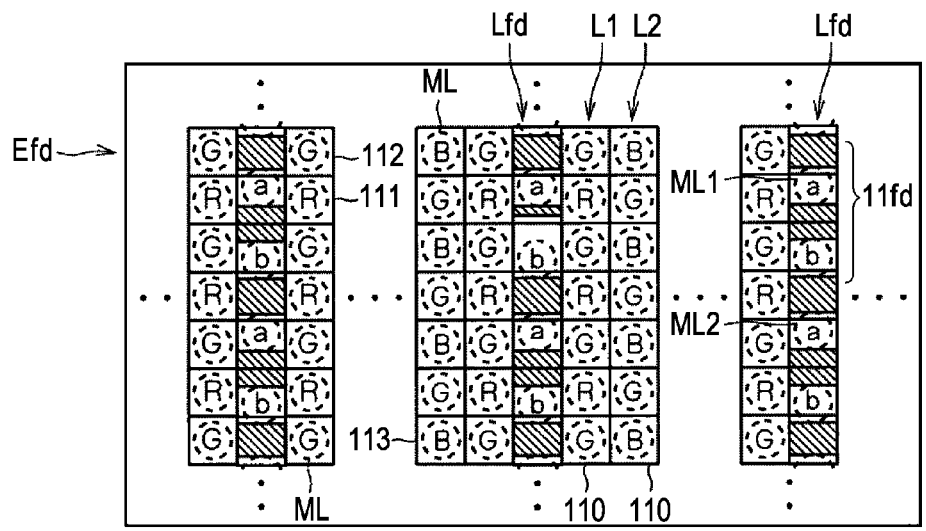
FIG. 21 is a diagram for explaining an AF area having the AF sensor portions.

In the above embodiment, the central photoelectric conversion portion PDm interposed between the pair of photoelectric conversion portions PD1 and PD2 in each AF sensor portion 11f shown in FIG. 9 may alternatively be omitted. In detail, as in an AF sensor portion 11fd shown in FIG. 20, instead of providing a photoelectric conversion portion between a pair of photoelectric conversion portions PD1 and PD2, a light-blocking section LSr disposed between a pair of micro-lenses ML1 and ML2 may be shortened by a length equivalent to one pixel relative to the light-blocking section LSp shown in FIG. 9. In consequence, as in an AF area Efd shown in FIG. 21, AF lines Lfd are formed such that the distance between each pair of micro-lenses ML1 and ML2 is reduced, thereby improving the accuracy of pupil segmentation.

Figure 22:
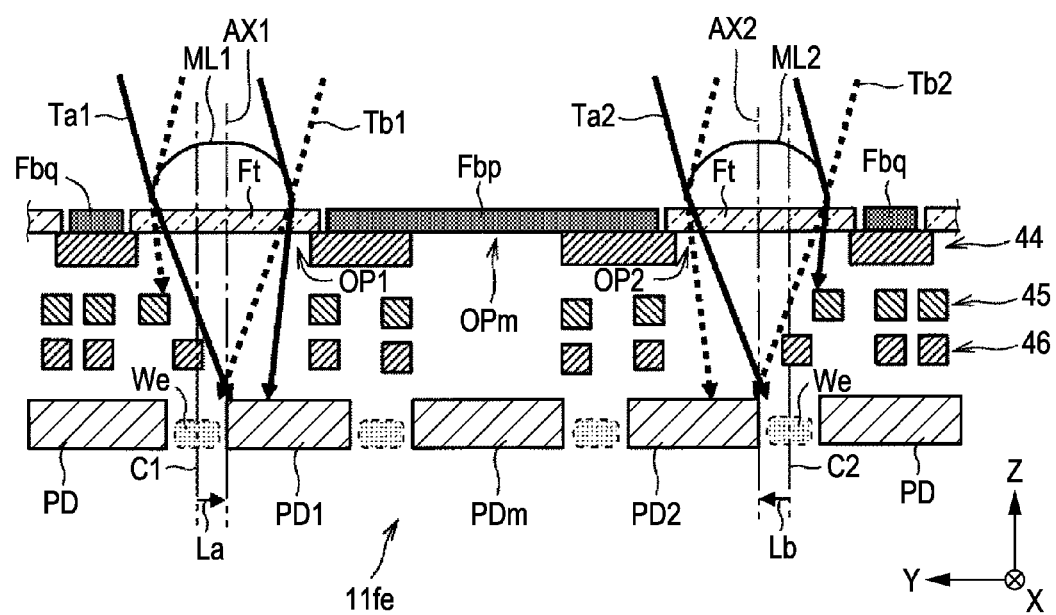
FIG. 22 is a diagram for explaining the configuration of an AF sensor portion according to another modification of the embodiment of the present invention.

As an alternative to the image pickup element 101 according to the above embodiment that employs the AF sensor portions 11f in which the first metallic layer 44 covers the underside of the black filters Fbp, as shown in FIG. 9, AF sensor portions 11fe each having an opening OPm in a section of a first metallic layer 44a directly below the black filter Fbp, as shown in FIG. 22, may be employed. In that case, the black filter Fbp preferably has low transmittance (of, for example, 3% or lower) to reduce the amount of light passing through the black filter Fbp to be optically received by the photoelectric conversion portion PDm disposed directly therebelow.

On the other hand, in the above embodiment, the black filters Fbp and Fbq in the configuration shown in FIG. 9 may be omitted. In that case, even though the aforementioned first metallic layer becomes exposed and there is a concern that ghost flare may occur, this can be prevented by, for example, coloring the upper surface of the first metallic layer in black or using a conductive layer composed of a black conductive material as the first metallic layer.

Although the image pickup element 101 having the AF lines Lf is provided in a single-reflex-type digital camera in the above embodiment, the image pickup element 101 may alternatively be provided in a compact-type digital camera.

Although the AF sensor portions in the above embodiment are each provided with transparent color filters above the openings OP1 and OP2 in the first metallic layer 44, the AF sensor portions may alternatively be provided with green color filters with high visibility in view of better focusing accuracy, or may be provided with red or blue color filters.

Although the light axes AX1 and AX2 of the micro-lenses ML1 and ML2 in each AF sensor portion in the above embodiment are exactly aligned with the upper edge Ha of the photoelectric conversion portion PD1 and the lower edge Hb of the photoelectric conversion portion PD2, respectively, as shown in FIG. 9, the light axes AX1 and AX2 may be slightly misaligned with the edges Ha and Hb. In other words, the light axes AX1 and AX2 of the micro-lenses ML1 and ML2 may be disposed to extend through the vicinities of the upper edge Ha and the lower edge Hb of the photoelectric conversion portions PD1 and PD2.

The embodiments of the present invention described above are only examples and are not intended to limit the invention. Countless modifications not described above are permissible insofar as they are within the scope of the invention.

What is claimed is:

1. An image pickup element comprising:
   a light-receiving portion having an arrangement of photoelectric conversion portions, the arrangement being formed by disposing a plurality of first-direction arrays, each having photoelectric conversion portions arranged in a first direction with a gap maintained therebetween, in a second direction that is orthogonal to the first direction; and
   a plurality of lenses provided above the light-receiving portion,
   wherein a certain first-direction array in the matrix arrangement of photoelectric conversion portions is provided with a pair of photoelectric conversion portions that optically receive, via a pair of lenses, light beams passing through a pair of regions in an exit pupil of an optical system, the pair of regions being disposed in opposite directions from each other in the first direction, and
   wherein the pair of lenses is disposed such that light axes thereof extend through vicinities of edges of the pair of photoelectric conversion portions, the edges being the farthest edges from each other in the first direction.

2. The image pickup element according to claim 1, wherein the gap has electrical wiring formed therein.

3. The image pickup element according to claim 1, wherein the pair of photoelectric conversion portions includes two neighboring photoelectric conversion portions disposed on opposite sides of one photoelectric conversion portion in the certain first-direction array.

4. The image pickup element according to claim 1, wherein the photoelectric conversion portions arranged in the arrangement have a rectangular shape in plan view, and
   wherein the first direction is a lateral direction of each photoelectric conversion portion.

5. The image pickup element according to claim 1, wherein linear members having light-blocking properties and disposed along the second direction are provided near outer sides, in the first direction, of line segments that respectively connect ends of the pair of lenses, which are the farthest ends from each other in the first direction, with the farthest edges.

6. An image pickup device comprising:
   an optical system; and
   an image pickup element configured to optically receive light passing through an exit pupil of the optical system,
   wherein the image pickup element includes
   a light-receiving portion having an arrangement of photoelectric conversion portions, the arrangement being formed by disposing a plurality of first-direction arrays, each having photoelectric conversion portions arranged in a first direction with a gap maintained therebetween, in a second direction that is orthogonal to the first direction; and
   a plurality of lenses provided above the light-receiving portion,
   wherein a certain first-direction array in the arrangement of photoelectric conversion portions is provided with a pair of photoelectric conversion portions that optically receive, via a pair of lenses, light beams passing through a pair of regions in the exit pupil, the pair of regions being disposed in opposite directions from each other in the first direction, and wherein the pair of lenses is disposed such that light axes thereof extend through vicinities of edges of the pair of photoelectric conversion portions, the edges being the farthest edges from each other in the first direction.

* * * * *